(12) United States Patent
Roberts

(10) Patent No.: US 10,076,050 B2
(45) Date of Patent: Sep. 11, 2018

(54) STORAGE AND CHARGING STATION SYSTEM FOR PORTABLE ELECTRONIC DEVICES

(71) Applicant: Nathan R. Roberts, Columbus, WI (US)

(72) Inventor: Nathan R. Roberts, Columbus, WI (US)

( * ) Notice: Subject to any disclaimer, the term of this patent is extended or adjusted under 35 U.S.C. 154(b) by 0 days.

(21) Appl. No.: 15/076,260

(22) Filed: Mar. 21, 2016

(65) Prior Publication Data

US 2016/0205800 A1 Jul. 14, 2016

Related U.S. Application Data

(63) Continuation-in-part of application No. 14/136,644, filed on Dec. 20, 2013.

(Continued)

(51) Int. Cl.
| | |
|---|---|
| *H05K 7/14* | (2006.01) |
| *H02J 7/00* | (2006.01) |
| *A47B 81/00* | (2006.01) |
| *A47B 57/20* | (2006.01) |
| *A45C 11/00* | (2006.01) |

(Continued)

(52) U.S. Cl.
CPC ............. *H05K 7/14* (2013.01); *A45C 11/00* (2013.01); *A45C 13/02* (2013.01); *A45C 15/00* (2013.01); *G06F 1/1632* (2013.01); *H02J 7/0027* (2013.01); *H02J 7/0042* (2013.01); *H02J 7/0044* (2013.01); *H04B 1/3888* (2013.01); *H05K 7/1401* (2013.01);

(Continued)

(58) Field of Classification Search
CPC ...... H02J 7/0027; H02J 7/0044; H02J 7/0042; H04Q 1/062; A45C 2011/002; A45C 11/00; A45C 13/02; A45C 15/00; H04B 1/3888; H04M 1/04; H05K 7/1401; H05K 7/18; H05K 7/14; F16M 11/42; A47B 81/00; A47B 45/00; A47B 57/20; A47B 2097/003; A47B 2097/006
USPC ..... 211/26, 26.2, 87.01, 90.01, 133.3, 133.4, 211/187
See application file for complete search history.

(56) References Cited

U.S. PATENT DOCUMENTS

| | | |
|---|---|---|
| 945,138 A | 1/1910 | Peterson et al. |
| 1,609,355 A | 12/1926 | Holle et al. |

(Continued)

OTHER PUBLICATIONS

G.D. Roberts Company, "Return-On-Investment White Paper," printout dated Mar. 1, 2016, http://www.powergistics.com/return-on-investment/, 12 pages.

(Continued)

*Primary Examiner* — Stanton L Krycinski
(74) *Attorney, Agent, or Firm* — Boardman & Clark LLP

(57) ABSTRACT

A storage and management assembly for a plurality of portable electronic devices is provided. The assembly includes a tower assembly to define a vertical channel along a first side of the tower assembly. A plurality of shelves are removably coupled to a second side of the tower assembly, wherein the second side is opposite the first side, each of the shelves includes a storage bay defined by a bottom portion provided perpendicular to the first member, and opposing raised edge portions provided about a portion of the perimeter of the bottom portion, the plurality of shelves provided in a stacked vertical arrangement along the tower assembly.

24 Claims, 31 Drawing Sheets

Related U.S. Application Data

(60) Provisional application No. 62/185,375, filed on Jun. 26, 2015, provisional application No. 62/135,549, filed on Mar. 19, 2015, provisional application No. 61/745,295, filed on Dec. 21, 2012.

(51) Int. Cl.

| | | |
|---|---|---|
| *A45C 13/02* | (2006.01) | |
| *A45C 15/00* | (2006.01) | |
| *H04B 1/3888* | (2015.01) | |
| *G06F 1/16* | (2006.01) | |
| *H04M 1/04* | (2006.01) | |
| *H04B 1/3877* | (2015.01) | |

(52) U.S. Cl.
CPC ... *A45C 2011/002* (2013.01); *A45C 2011/003* (2013.01); *H04B 1/3877* (2013.01); *H04M 1/04* (2013.01)

(56) References Cited

U.S. PATENT DOCUMENTS

| | | | |
|---|---|---|---|
| 2,920,244 | A | 1/1960 | Jones et al. |
| 4,095,861 | A | 6/1978 | Kachidurian et al. |
| 4,203,373 | A | 5/1980 | Conti et al. |
| 4,371,083 | A | 2/1983 | Zingrini et al. |
| 4,497,411 | A | 2/1985 | DeBortoli et al. |
| 4,662,524 | A | 5/1987 | Fullenkamp et al. |
| 5,186,337 | A | 2/1993 | Foster et al. |
| 5,644,876 | A | 7/1997 | Walker |
| 5,902,961 | A | 5/1999 | Viklund et al. |
| 6,102,214 | A | 8/2000 | Mendoza |
| 6,142,595 | A | 11/2000 | Dellapi et al. |
| 6,202,570 | B1 | 3/2001 | Kurtsman et al. |
| 6,223,909 | B1 | 5/2001 | Mendoza et al. |
| 6,347,714 | B1 | 2/2002 | Fournier et al. |
| 6,489,565 | B1 | 12/2002 | Krietzman et al. |
| 6,501,899 | B1 | 12/2002 | Marrs et al. |
| 6,504,100 | B2 | 1/2003 | Lawrence et al. |
| 6,541,705 | B1 | 4/2003 | McGrath et al. |
| 6,584,267 | B1 | 6/2003 | Caveney et al. |
| 6,614,978 | B1 | 9/2003 | Caveney et al. |
| 6,708,830 | B2 | 3/2004 | Mendoza et al. |
| 6,823,063 | B2 | 11/2004 | Mendoza et al. |
| 7,172,077 | B2 | 2/2007 | Mendoza et al. |
| 7,417,188 | B2 | 8/2008 | McNutt et al. |
| 7,562,779 | B2 | 7/2009 | Bravo et al. |
| 7,762,405 | B2 | 7/2010 | Mcgrath et al. |
| 8,143,521 | B2 | 3/2012 | Burek et al. |
| D671,068 | S | 11/2012 | Gieniec |
| 8,307,996 | B2 | 11/2012 | Taylor |
| 8,628,157 | B2 | 1/2014 | Burek et al. |
| 8,833,571 | B2 | 9/2014 | Anderson |
| 9,124,105 | B2 | 9/2015 | Gunderman et al. |
| 9,323,288 | B2 | 4/2016 | Dresser, III |
| 9,343,916 | B2 | 5/2016 | Emslie |
| 2004/0007372 | A1 | 1/2004 | Krietzman et al. |
| 2004/0168818 | A1 | 9/2004 | Layden et al. |
| 2005/0275178 | A1* | 12/2005 | Huesdash ............ A47B 57/482 280/47.35 |
| 2006/0171651 | A1* | 8/2006 | Laursen ................ H04Q 1/064 385/135 |
| 2009/0157907 | A1 | 6/2009 | Chapman et al. |
| 2010/0133391 | A1 | 6/2010 | Taylor et al. |
| 2010/0176762 | A1 | 7/2010 | Daymude et al. |
| 2012/0234778 | A1 | 9/2012 | Anderson et al. |
| 2014/0062390 | A1 | 3/2014 | Webber et al. |
| 2014/0175031 | A1 | 6/2014 | Roberts |

OTHER PUBLICATIONS

Power Tower, "Power Tower Charging Stations & Kiosks," printout dated Mar. 27, 2014, http://www.powertower.us/, 7 pages.

* cited by examiner

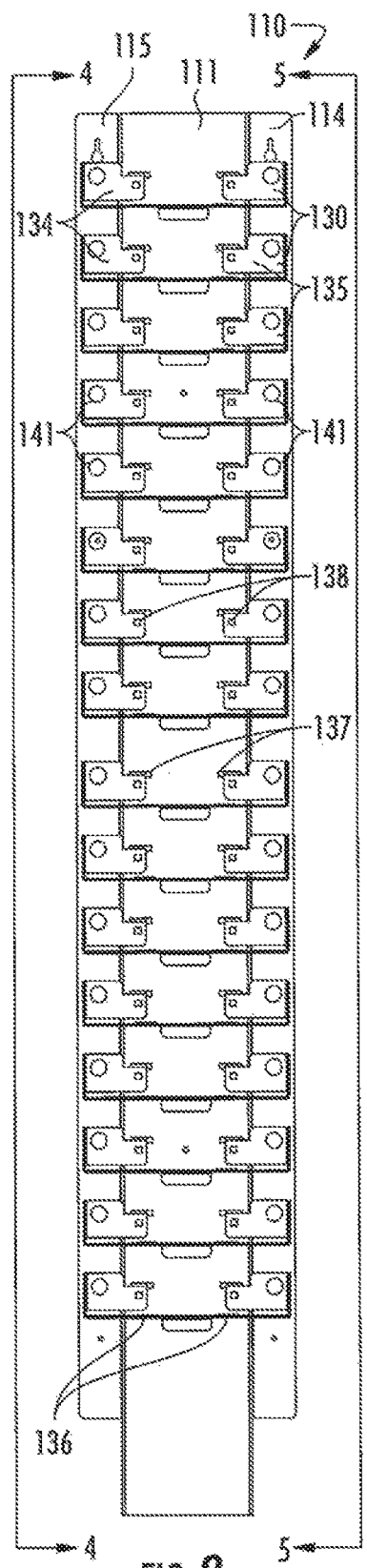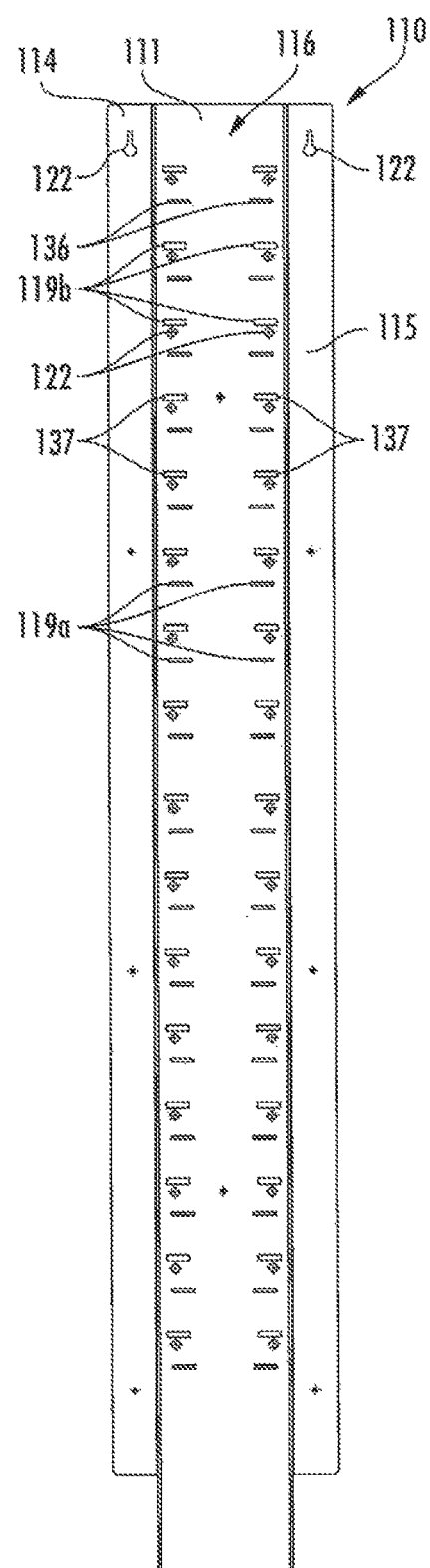
FIG. 2                    FIG. 3

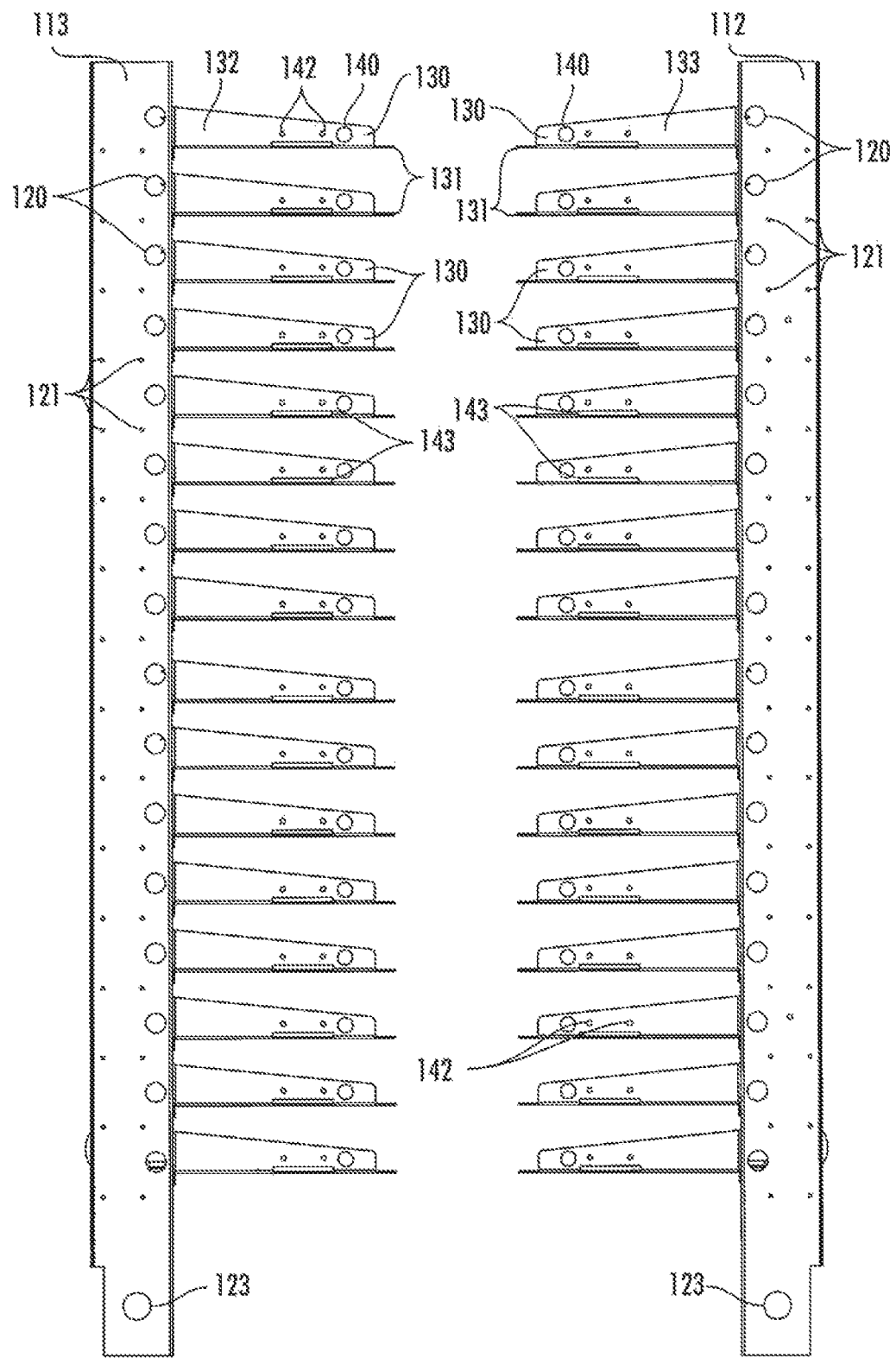

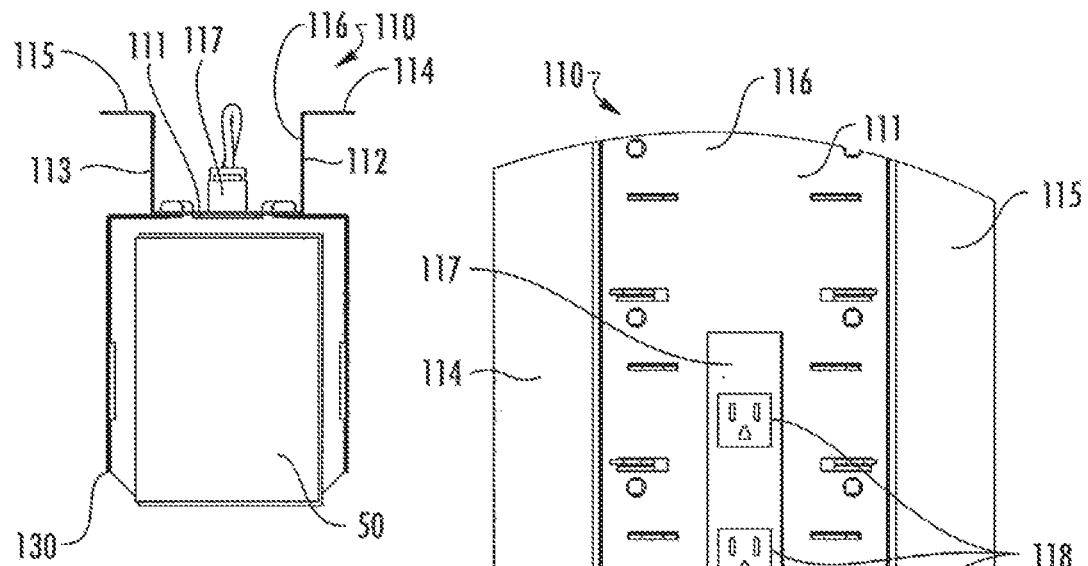

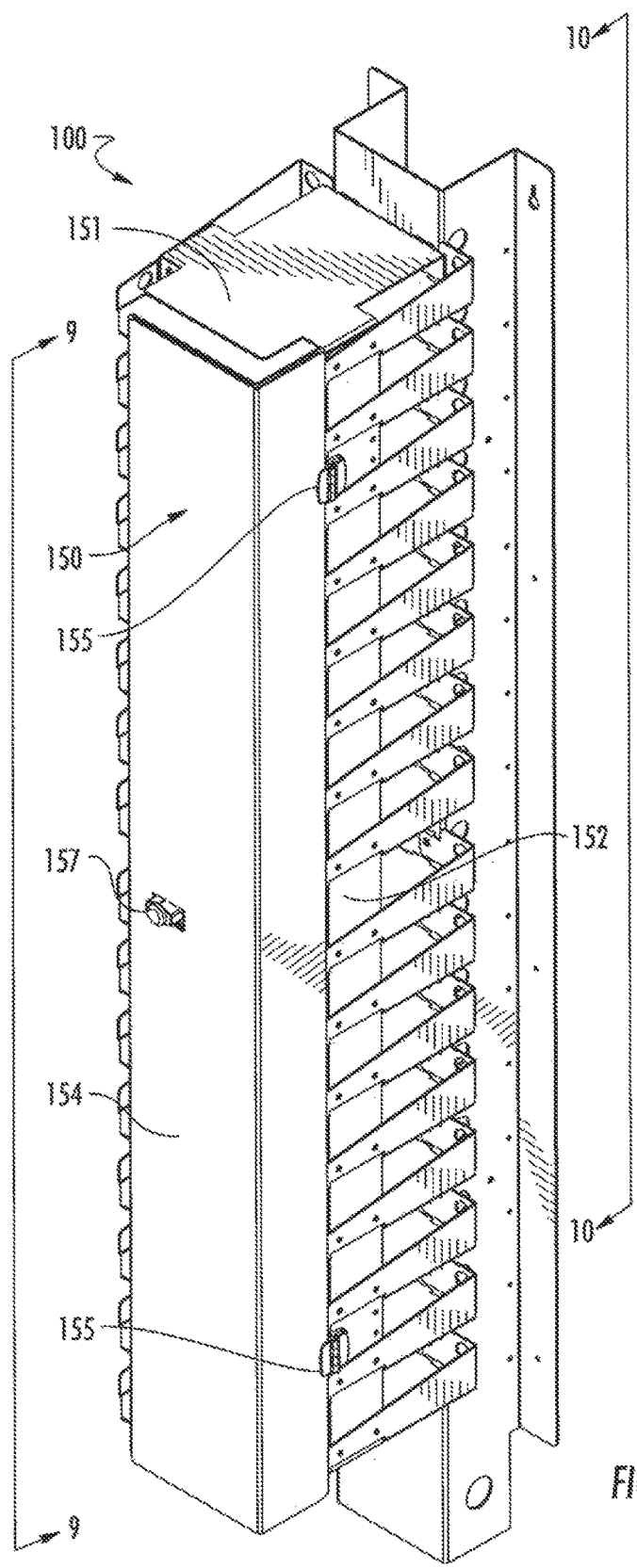

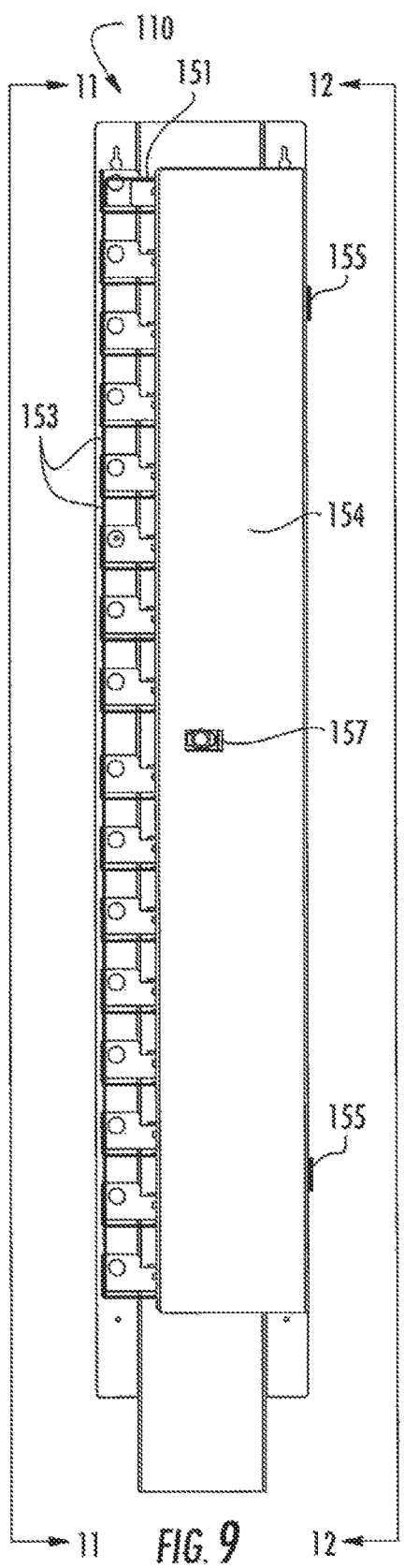
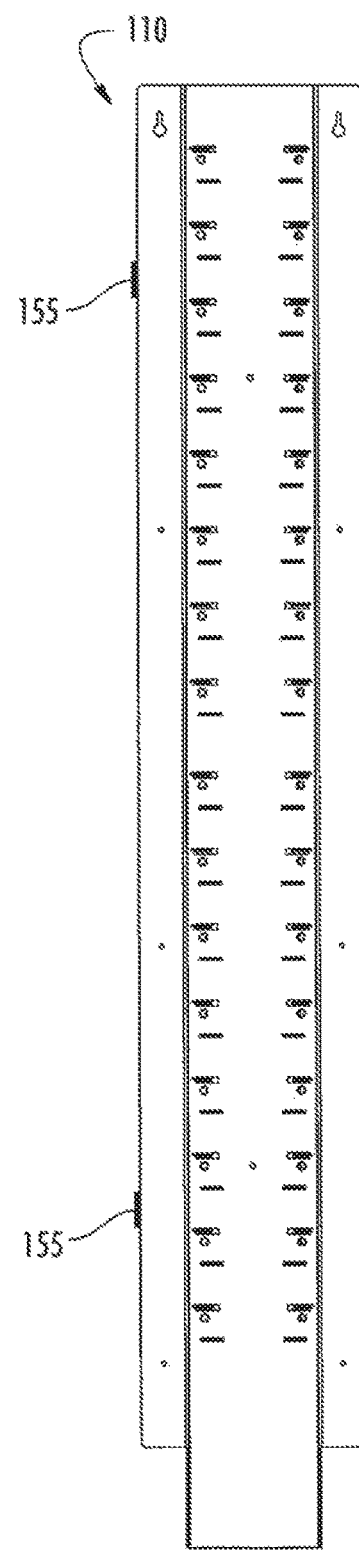
FIG. 9
FIG. 10

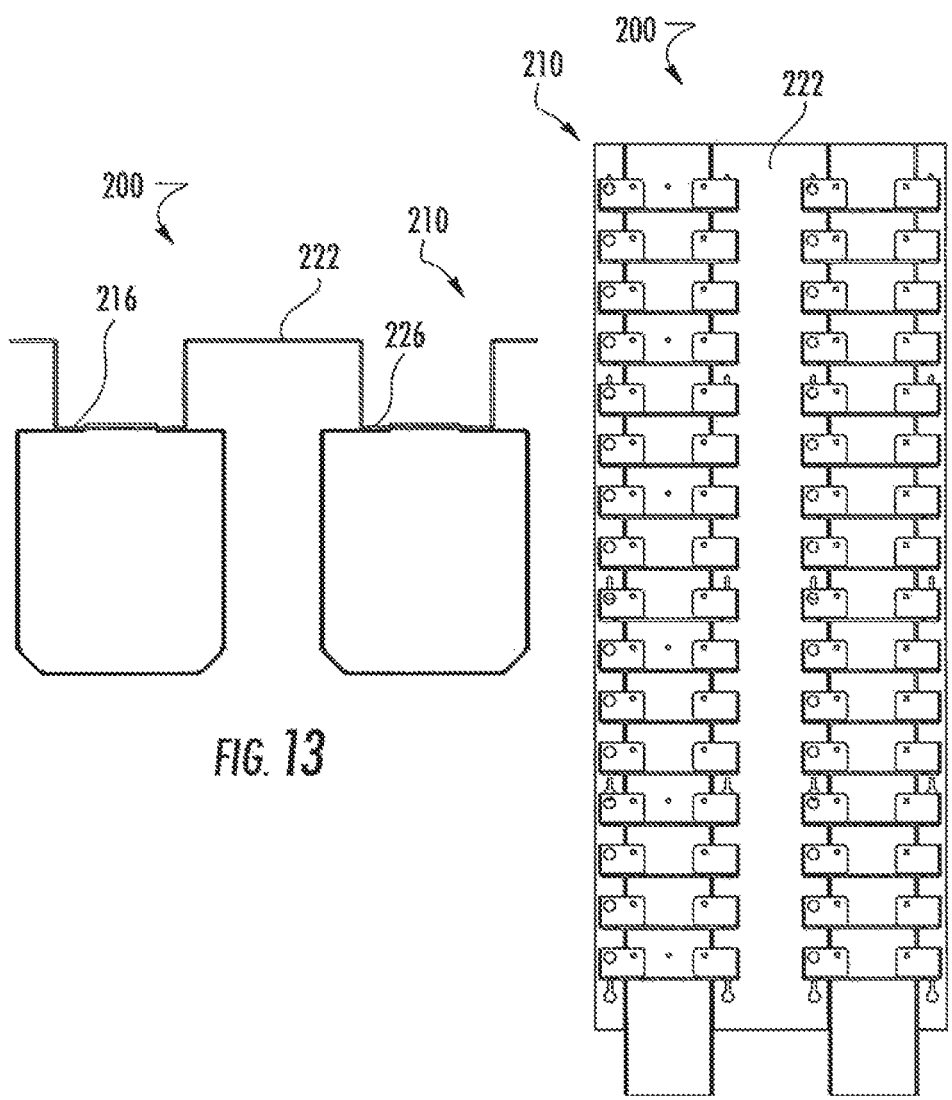

SECTION A-A

STORAGE AND CHARGING STATION SYSTEM FOR PORTABLE ELECTRONIC DEVICES

CROSS-REFERENCE TO RELATED APPLICATIONS

This application claims priority to and is a continuation-in-part of U.S. Nonprovisional patent application Ser. No. 14/136,644 entitled "Storage and Charging Station System for Portable Electronic Devices" filed on Dec. 20, 2013, which claims the benefit of U.S. Provisional Application No. 61/745,295, filed on Dec. 21, 2012, and in addition this application claims the benefit of the disclosure of U.S. Provisional Patent Application No. 62/135,549 filed on Mar. 19, 2015, entitled "Improved Storage and Charging Station System for Portable Electronic Devices," and claims the benefit of the disclosure of U.S. Provisional Patent Application No. 62/185,375 filed on Jun. 26, 2015, entitled "Improved Mobile Storage and Charging Station System for Portable Electronic Devices," the contents of each of which are hereby incorporated by reference in their entirety.

FIELD OF THE INVENTION

The present invention relates to storage and charging systems for electronic devices. More specifically, the present invention relates to a system for centralized storage, charging, deployment, and inventorying of a plurality of portable electronic devices.

BACKGROUND

Portable electronic devices are generally known in the art. Portable electronic devices are quickly becoming common place in personal and professional endeavors, including educational and business settings. While use of portable electronic devices initially grew with individual use, organizations, including educational and business organizations, now will purchase a number of portable electronic devices for use by students, employees, or other users.

These purchasing organizations may desire a certain amount of control upon the portable electronic devices. The amount of control to assert may be dependent upon a number of factors considered by organizations, including, but not limited to, management of the portable electronic devices, inventory of the portable electronic devices, the type of user of portable electronic devices, the number of users for each portable electronic device, the environment in which the portable electronic device is in use, the relationship between the user and organization, the number of portable electronic devices in use, updating and maintenance of the portable electronic devices, and/or minimizing risk of loss and/or replacement costs of the portable electronic devices. Which factor(s) have the greatest weight dictating the necessary amount of control will be dependent upon the specific purchasing organization.

For example, in a school setting, a portable electronic device may be assigned to a specific student. That student may pick up the portable electronic device at a certain time during the school day, such as at the beginning of the school day, use it throughout the school day, and return the portable electronic device at the end of the school day. In another example, in a school setting, a classroom of students may use a number of portable electronic devices for a period of time during the day. As the students turn over in the classroom, such as by changing classes during the day, different students may use the number of portable electronic devices. As such, a plurality of different students may use a single portable electronic device during a day. In both of these examples, while utilizing the portable electronic devices as an educational tool is an outstanding way for students to learn, it can lead to issues in maintaining the portable electronic devices. For example, it may be difficult to inventory the devices during the day, charge or recharge the devices, account for the return of all devices once students complete use of the devices, and/or efficiently deploy new software or associated updates.

Similar to a school setting, portable electronic devices may be deployed for public use at libraries or other public access buildings. In this setting, the portable electronic devices may be checked out to users for a period of time. Again, many of the same problems as would arise in an educational setting, such as the ability to inventory or account for the return of all devices may arise at these public settings.

As another example, businesses or hospitals/medical service providers may deploy portable electronic devices in association with business operations or providing medical services, respectively. In order for efficiency or operational gains to be realized by use of the portable electronic devices, the portable electronic devices must be operational and must be used. The inability of the business or medical service provider to control the portable electronic devices can interrupt any efficiency or operational gains. For example, should an employee take a portable electronic device from the premises and forget to return it, that employee will not be able to use the portable electronic device during performance of his or her job. Similarly, if an employee fails to charge or recharge the battery of the portable electronic device, the portable electronic device can run out of power during an employee's work day, rendering the portable electronic device useless. As another example, should an employee remove the portable electronic device from the premises, the information stored on the electronic device may be misappropriated. This and other situations not referenced can lead to inefficiencies and unnecessary risks of loss.

As another example, various service industries may deploy portable electronic devices in association with the performance of services. As an example, certain service providers may employ a plurality of employees whom are deployed off-site to perform their job. These employees may each require a portable electronic device in the performance of their job responsibilities. In addition, these employees may require daily travel in the performance of their job responsibilities. Again, many of the same problems as recited above, such as forgetting, misplacing, losing, or failing to fully recharge portable electronic devices, or the failure of employees to properly maintain the portable electronic devices, may lead to interruption of efficiency, loss of operational gains, and/or unnecessary risk of loss.

As another example, sports teams may deploy portable electronic devices in association with preparation of athletes for sporting activities. For example, local, college, and/or professional sports teams may employ portable electronic devices to communicate plays or other game planning materials for athletes. For example, a sports team, such as an American football team, may communicate a playbook on a portable electronic device assigned to each player. While the portable electronic devices provide the ability for the player to easily transport and use game preparation materials outside of athletic facilities, there are some disadvantages. For example, it can be difficult for the sports team to easily and efficiently update game planning materials. Again using the example of an American football team, a professional team typically has 53 active players divided between offense and defense. Game planning materials typically are updated on a weekly basis depending upon the opponent any given week. Accordingly, it can be difficult to quickly and efficiently distribute updated game preparation materials to the portable electronic devices assigned to each of the players. Further, the updating and distribution process becomes more onerous considering the minimum frequency of weekly update distribution.

Accordingly, what is needed is a system for centrally storing a number of portable electronic devices in a predetermined location. In addition, the system would allow for the batteries of the portable electronic devices to be charged and/or recharged. In addition, the system would provide a system for locking or protecting the portable electronic devices from misuse or theft. In addition, the system would provide a systematic fashion to facilitate storage, security, accountability, and instant inventory verification for the efficient management and use of the portable electronic devices. In addition, the system would provide for convenient and easy movement of the mobile tower assembly between locations for storage, for charging of loaded electronic devices and for self-dispensing and/or return of portable electronic devices by users at convenient user sites.

SUMMARY OF THE DESCRIPTION

The present invention provides one or more examples of embodiments of a storage system for portable electronic devices. The system additionally provides for the charging and/or recharging of batteries which operate the portable electronic devices. The system additionally has a vertical profile to allow for the storage and charging of a number of portable electronic devices while minimizing the amount of space consumed by the system. The system additionally is expandable, providing for the easy addition or removal of storage bays. In addition, the system provides for easy verification of inventory and confirmation of device charging, as each of the storage bays has unique spacing and a tapered side arrangement to allow the contents of each storage bay to be easily visible. Further, the system implements a cable management system to provide for centralized charging and/or data distribution to the plurality of devices while reducing the visibility and entanglement of associated cables. In addition, the system distributes power to the plurality of devices to facilitate charging or recharging of the devices. The system further may incorporate a locking assembly to lock the plurality of devices into the assembly and reduce the risk of device theft. The storage and charging system advantageously provides for a central location for the storage, inventory, and identification of portable electronic devices, assisting in the deployment, inventory, management, and theft reduction of large numbers of portable electronic devices.

A storage and management assembly for a plurality of portable electronic devices is provided. The assembly includes a tower assembly having a first member coupled to a second member, and the first member coupled to a third member, the second and third members extending away from the first member to define a vertical channel along a first side of the tower assembly. In addition, a plurality of shelves are coupled to a second side of the tower assembly, wherein the second side is opposite the first side, each of the shelves includes a storage bay defined by a bottom portion provided generally perpendicular to the first member, opposing raised edge portions provided about a portion of the perimeter of the bottom portion, the plurality of shelves provided in a stacked vertically spaced arrangement along the tower assembly.

In addition, a storage and management tower assembly for a plurality of portable electronic devices is provided. The assembly includes a tower support, a cable management system defined by the tower support, the cable management system includes a central channel provided on a first side of the tower support, a plurality of shelves coupled to a second side of the tower support, the second side being opposite the first side, the plurality of shelves are provided in vertical alignment along the tower support, each of the plurality of shelves includes a storage bay defined by a bottom portion provided perpendicular to the tower support, opposing raised edge portions provided about a portion of the perimeter of the bottom portion, and back tabs provided about a portion of the perimeter of the bottom portion, a plurality of cable apertures provided through the tower support, wherein at least one cable aperture may be provided for each of the plurality of shelves, and a plurality of shelf apertures, wherein at least one shelf aperture may be provided in each of the plurality of shelves, the at least one shelf aperture is provided in one of the opposing raised edge portions or back tabs, wherein the cable management system facilitates storage and protection of one or more cables by allowing the one or more cables to extend from the central channel, through any such plurality of cable apertures, through the plurality of shelf apertures, to each of the shelves.

An expandable storage assembly for storing a plurality of portable electronic devices is also provided. The assembly includes a tower support portion having a first member coupled to a second member, and a third member coupled to the first member, the second and third members being provided at an angle to the first member such that the first, second, and third members define a vertical channel provided on a first side of the tower support portion. A plurality of vertically stacked shelves are coupled to a second side of the tower support portion, the second side being opposite the first side, each of the shelves include a storage bay defined by opposing first and second edge portions which extend away from a bottom portion, the first and second edge portions may have a tapered height as the first and second edge portions extend away from the tower support to provide visibility into each of the stacked shelves.

An improved storage management system for electronic devices is provided, having shelves with a cutout allowing the user to easily grab the electronic device off the chosen shelf where the device is stored.

An improved storage management system for electronic devices is also provided with a snap-in system adapted to accept multiple shelf sizes. This feature allows for multiple device types to be stored in the same tower with the appropriate shelf size. The snap-in fastening feature allows the easy customization of the tower and shelf sizes.

An improved storage management system for electronic devices is also provided with a cable management system that is access paneled and has specialized apertures for safe and neat organization of charging devices.

An improved storage management system for electronic devices is also provided having a specialized coupling mechanism between the tower and base. Further, the improved storage management system for electronic devices is specially adapted to sit on the floor and anchor in part into the wall.

An improved mobile charging and storage system for portable electronic devices is provided, having substantially all of the structure and advantages of the structure of FIGS. 1-12 of referenced U.S. Provisional Application No. 62/135,549, and additional advantages. The storage system disclosed herein exemplarily includes an improved mobile base which will securely support in a stationary position a tower assembly having a tower support as shown by FIGS. 1-12 referenced above, and other tower supports as disclosed herein, and which also conveniently may combine with a securely engaged support frame or modified tower support to permit convenient and easy dolly-like movement of the assembled and loaded mobile tower assembly between locations for storage, for charging of loaded electronic devices, and for self-dispensing and/or return of portable electronic devices by users at convenient user sites.

An improved mobile charging and storage system for electronic devices is provided, having shelf portions for individually and securely receiving portable electronic devices in lockable compact storage arrays which prevent unauthorized withdrawal of electronic devices, but facilitate convenient loading and unloading of the portable devices on and from the shelf portions by authorized users at convenient locations within or externally of multi-function facilities.

An improved mobile charging and storage system for electronic devices is provided, having lockable compartment space for securing power distribution strips and connectors, charging and data transfer cables, and other power access and distribution circuit components when the mobile charging and storage system is in transit or otherwise positioned and stored in use or charging or storage locations.

Specific details regarding the previously disclosed features and advantages, as well as further features and advantages are disclosed below.

BRIEF DESCRIPTION OF THE DRAWINGS

FIG. 2 is a front elevation view of the storage and charging station system of FIG. 1, taken along line 2-2 of FIG. 1.

FIG. 3 is a rear elevation view of the storage and charging station system of FIG. 1, taken along line 3-3 of FIG. 1.

FIG. 4 is a first side elevation view of the storage and charging station system of FIG. 1, taken along line 4-4 of FIG. 2.

FIG. 5 is a second side elevation view of the storage and charging station system of FIG. 1, taken along line 5-5 of FIG. 2.

FIG. 6 is a top down plan view of one or more examples of embodiments of a storage and charging station system for portable electronic devices illustrating a power supply mounted in the channel of the tower support.

FIG. 7 is a partial rear elevation view of the storage and charging station system of FIG. 6.

FIG. 8 is an isometric view of one or more examples of embodiments of a storage and charging station system for portable electronic devices incorporating a locking assembly.

FIG. 9 is a front elevation view of the storage and charging station system of FIG. 8, taken along line 9-9 of FIG. 8.

FIG. 10 is a rear elevation view of the storage and charging station system of FIG. 8, taken along line 10-10 of FIG. 8.

FIG. 13 is a top down view of one or more examples of embodiments of a storage and charging station system for portable electronic devices, wherein the system includes multiple rows of vertically spaced shelves.

FIG. 14 is a front elevation view the storage and charging station system of FIG. 13.

It should be understood that the Figures are not necessarily to scale. In certain instances, details that are not necessary to the understanding of the invention or render other details difficult to perceive may have been omitted. It should also be understood that the invention is not necessarily limited to the particular embodiments illustrated herein.

DETAILED DESCRIPTION

The invention illustrated in the Figures and disclosed herein is generally directed to one or more embodiments of a storage and charging station system for portable electronic devices. For ease of discussion and understanding, the following detailed description will at times refer to a "portable electronic device" 50, an "electronic device" 50, or a "plurality of electronic devices" 50. While certain Figures illustrate an electronic device 50 as a laptop computer, it should be appreciated that an electronic device may be any suitable portable electronic device requiring storage and/or battery charging or recharging. For example, an electronic device 50 may include, but is not limited to, a laptop computer, a netbook computer, a notebook computer, a Google Chromebook™ computer, a tablet device (such as an Apple iPad®, Samsung Galaxy®, or Microsoft Surface®, or any similar known or future developed tablet), a mobile smartphone, or any other known or future developed mobile or portable electronic device.

Figure 1:
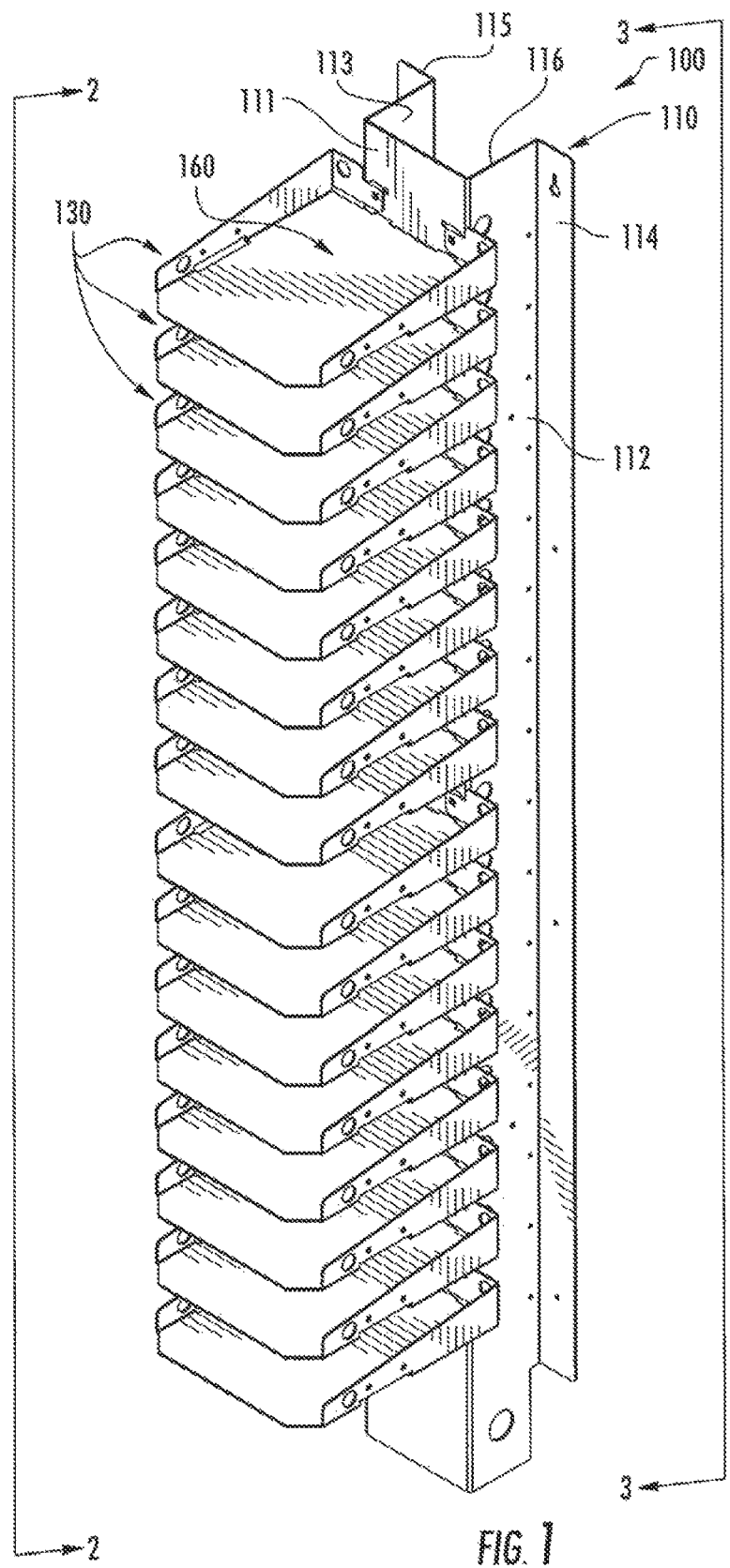
FIG. 1 is an isometric view of one or more examples of embodiments of a storage and charging station system for portable electronic devices.

Referring now to the Figures, FIGS. 1-5 illustrate one or more examples of embodiments of a storage and charging station assembly. Referring to FIG. 1, a tower assembly 100 is provided. Tower assembly 100 may include a mounting support portion or tower support 110. A plurality of shelf portions 130 may be coupled to tower support 110. Each of the plurality of shelf portions 130 defines a storage bay 160 for receiving an electronic device 50 (not shown). The plurality of shelf portions 130 may be provided in a linear, spaced or stacked configuration on tower support 110. This configuration advantageously conserves space, minimizing the footprint of assembly 100. While mounting support portion 110 of FIG. 1 illustrates an array of sixteen shelf portions 130 coupled thereto, it should be appreciated in one or more examples of embodiments that the mounting support portion 110 may be any suitable size or length to support any desired number of shelf portions 130, which may be more than sixteen or less than sixteen. In addition, in one or more examples of embodiments, any desired or suitable number of shelf portions 130 may be provided on tower assembly 100. For example, a desk top arrangement of tower assembly 100 having fewer than sixteen shelf portions 130 may be provided, wherein the tower assembly 100 is free standing or includes a support base, for positioning on a desk, table, shelf, or any other desired structure. The tower assembly components may be constructed of powder coated aluminum, injection molded plastic or any other suitable structure. In addition, the tower assembly may be customized with one or more different colors including school colors, identifying business colors, etc.

Referring now to FIGS. 1 and 6, support portion 110 may include a first support member or portion 111, a second support member or portion 112, and a third support member or portion 113. More specifically, first member 111 may be coupled to second member 112, and first member 111 may be coupled to third member 113. Preferably, second and third members 112, 113 are provided at an angle to first member 111 to define a cable management channel 116 and may consist of a single unitary sheet bent or formed into a single channel shape. As such, channel 116 is defined by first, second, and third members 111, 112, 113. Channel 116 is provided on the side of first member 111 opposite the plurality of shelf portions 130. As illustrated in FIGS. 1 and 6, second and third members 112, 113 may be provided parallel to one another, and further provided approximately perpendicular to first member 111. However, in one or more examples of embodiments, second and third members 112, 113 may be provided at any suitable angle to first member 111 to define channel 116. First, second, and third members 111, 112, 113 may be formed of a unitary pressed, bent or molded material. However, it should be appreciated that in one or more examples of embodiments, first, second, and third members 111, 112, 113 may be two or more pieces coupled together, for example by weld.

Support portion 110 may also include a first wall engaging tab or fourth support member or portion 114 and a second wall engaging tab or fifth support member or portion 115. First wall engaging tab 114 may be coupled to second member 112, while second wall engaging tab 115 may be coupled to third member 113. Wall engaging tabs 114, 115 may be provided approximately planar to one another to facilitate coupling to a flat surface, such as a wall. In addition, wall engaging tabs 114, 115 may be provided approximately parallel to first member 111. In addition, wall engaging tabs 114, 115 may be provided at an angle to second and third members 112, 113. For example, as illustrated, wall engaging tabs 114, 115 may be provided approximately perpendicular to second and third members 112, 113. As illustrated in FIG. 3, wall engaging tabs 114, 115 may each include one or more mounting apertures 122 adapted to receive a mounting member (not shown), such as a screw, nail, or any other suitable mounting device. Mounting member may be used to mount assembly 100 to a surface, such as a wall. First, second, and third members 111, 112, 113 and wall engaging tabs 114, 115 may be formed of a unitary material. However, it should be appreciated that in one or more examples of embodiments, first, second, and third members 111, 112, 113 and wall engaging tabs 114, 115 may be two or more pieces coupled together, for example by weld.

Referring now to FIGS. 4 and 5, each of the plurality of shelf portions 130 may include a bottom portion 131, a first edge portion 132, and a second edge portion 133. Referring to FIG. 2, each shelf portion 130 may also include a first back tab 134 and a second back tab 135, which back tabs may each be formed from a portion of the bottom portion 131, or from a portion of the adjacent first edge portion 132 or second edge portion 133, as shown in FIG. 2. Alternatively, a single back tab could extend across all or a portion of the back margin of the shelf 130. First edge portion 132, second edge portion 133, first back tab 134, and second back tab 135 generally surround a portion of the perimeter of bottom portion 131 and define a storage bay for an electronic device. In addition, first and second edge portions 132, 133, and first and second back tabs 134, 135 may be provided approximately perpendicular to the plane of bottom portion 131. As such, first and second edge portions 132, 133, and first and second back tabs 134, 135 may assist in the retention of a portable electrical device in the storage bay by forming a portion of the perimeter of bottom portion 131.

Referring back to FIGS. 4 and 5, first and second edge portions 132, 133 may have a tapered height as shown. As first and second edge portions 132, 133 extend away from back tabs 134, 135, the height of first and second edge portions 132, 133, as measured by a distance perpendicular to bottom portion 131, decreases. Stated otherwise, the edge of first and second edge portions 132, 133 furthest away from bottom portion 131 has a negative slope from an edge closest to back tabs 134, 135 to an edge furthest away from back tabs 134, 135. The decreasing slope or decreasing height creates sufficient open area to allow for a user to quickly and accurately identify, confirm, and/or inventory electronic devices stored in the storage bay of each shelf portion 130.

Referring to FIGS. 2 and 3, each of the plurality of shelf portions 130 may include one or more retaining tabs 136. Retaining tabs 136 may project away from bottom portion 131. In addition, retaining tabs 136 are preferably parallel to bottom portion 131. Each of the plurality of shelf portions 130 may also include one or more retaining hooks 137. A retaining hook 137 may be respectively coupled to first and second back tabs 134, 135. Retaining hooks 137 preferably project away from first and second back tabs 134, 135. Further, retaining hooks 137 are preferably parallel to bottom portion 131. Each retaining hook 137 may include a laterally projecting hook portion 137a defining a shallow channel between the hook portion and the rear surface of the back tab 134 or 135 from which the hook projects. Each of the plurality of shelf portions 130 may also include one or more retaining apertures 138. A retaining aperture 138 may be provided in each of the first and second back tabs 134, 135. Retaining apertures 138 may be aligned with a corresponding shelf attachment member aperture 122 provided in first member 111 of tower support 110.

The plurality of shelf portions 130 may be removably attached or coupled to mounting support portion 110. The removability and/or additive nature of shelf portions 130 provides expandability for the addition or removal of one or more shelf portions 130. In addition, the location of shelf portions 130 may be customized based upon the heights of the users. For example, in end uses where users may be shorter, such as a primary school setting, shelf portions 130 may be provided at lower locations of tower support 110 to correspond for the relatively shorter heights of the users. Similarly, in end uses where users may be taller, such as a secondary school setting, shelf portions 130 may be provided at higher locations of tower support 110 to correspond for the relatively taller heights of the users.

Referring now to FIGS. 2 and 3, the retaining tabs 136 of each shelf portion 130 are removably received by a respective first shelf receiving slot 119a provided in mounting support portion 110. Preferably, first shelf receiving slots 119a are provided through first member 111. In addition, each retaining hook 137 of each shelf portion 130 is removably received by a respective second shelf receiving slot 119b provided in mounting support portion 110. Preferably, second shelf receiving slots 119b are also provided through first member 111. When each shelf portion 130 is engaged with first member 111, each retaining tab 136 is received by an associated first shelf receiving slot 119a, while each retaining hook 137 is received by an associated second shelf receiving slot 119b. In addition, the channel defined by the hook portion 137a of each retaining hook 137 receives a portion of first member 111. More specifically, a portion of the hook 137 is received by second shelf receiving slot 119b such that an end edge portion of the slot 119b defined by the first member 111 is received within the channel defined by the hook portion 137a of each retaining hook 137. To further facilitate engagement and retention of shelf portions 130 to mounting support portion 110, the first and second back tabs 134, 135 of each shelf portion 130 may have a bias. The bias preferably is in a direction to encourage the first member 111 to be received within the channel defined by the hook portion 137a and engage each retaining hook 137 upon receipt of each retaining hook 137 by the associated second shelf receiving slot 119b.

Figure 2A:
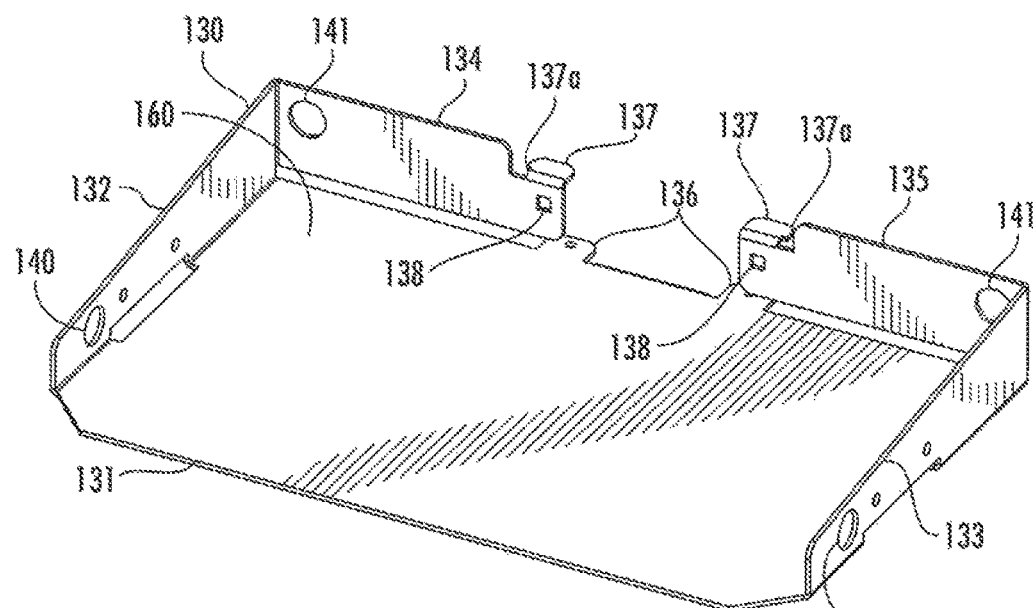
FIG. 2A is an isometric view of an example of an embodiment of a shelf portion which may be attached to a tower support of the storage and charging station system of FIG. 1.
Figure 2B:
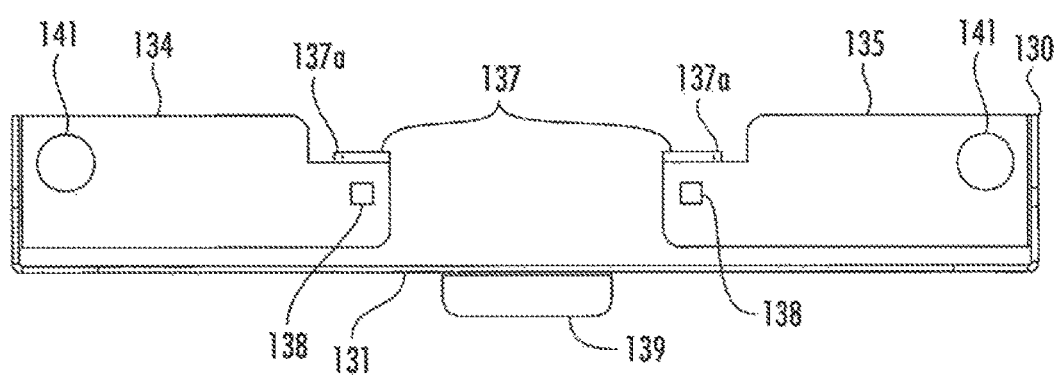
FIG. 2B is a front view of the shelf portion of FIG. 2A.
Figure 11:
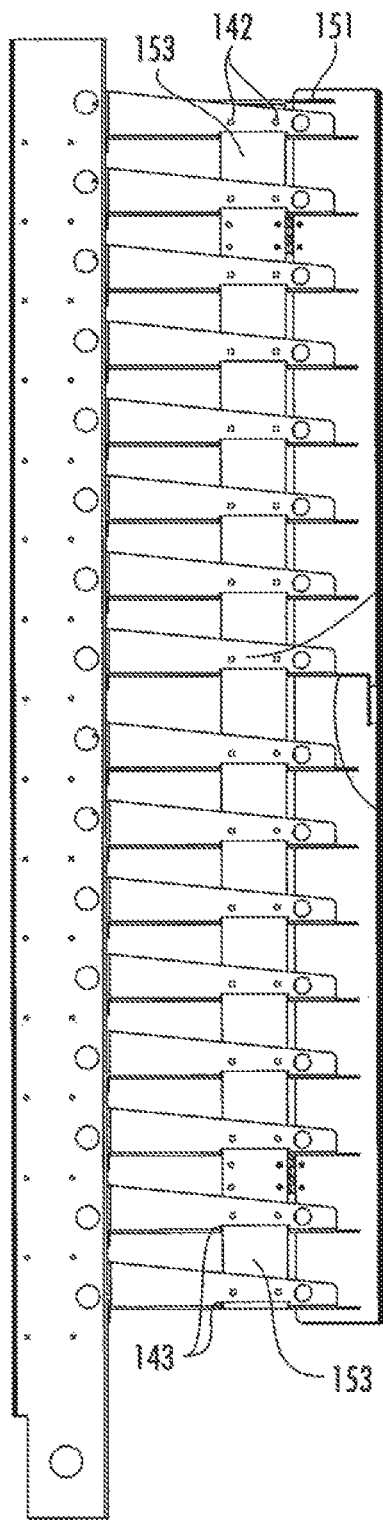
FIG. 11 is a first side elevation view of the storage and charging station system of FIG. 8, taken along line 11-11 of FIG. 9.
Figure 12:
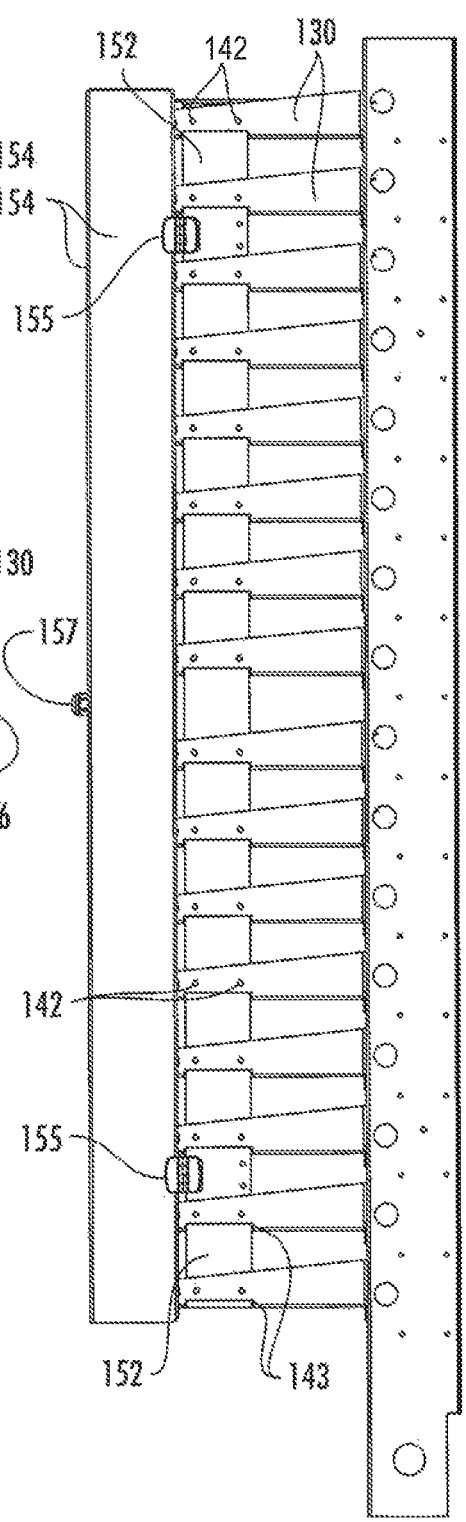
FIG. 12 is a second side elevation view of the storage and charging station system of FIG. 8, taken along line 12-12 of FIG. 9.

As best illustrated in FIGS. 2A and 2B, in an exemplary embodiment the first edge portion 132 is integrally formed with and at an approximately right angle to a first side of the bottom portion 131, while the back tab 134 is integrally formed with and at an approximately right angle to the first edge portion, such that the first edge portion 132 extends upwardly from a side of the bottom portion 131, and the back tab 134 extends from the back end of the first edge portion 132 generally parallel to the back edge of the bottom portion 131. The first edge portion 132 thus has a vertical bias which positions the retaining hook a fixed distance from the first side of the bottom portion 131. The second edge portion 133, back tab 135 and attached retaining hook 137 are likewise attached to the opposite second side of the bottom portion 131 and each other to likewise position the attached retaining hook a fixed distance from the second side of the bottom portion. The retaining hooks are thus seen to have a structural bias toward fixed spaced positions above the back edge of the bottom portion 131. To facilitate connection of a shelf portion 130 to the first member 111, it can be seen that the side edge portions 132 and 133 may be manually flexed toward each other to reduce the distance between the retaining hooks 137 and to permit the retaining hooks to be inserted into the second shelf retaining slots 119b in the first member. The outer margins of the retaining slots 119b are more closely spaced from each other than the distal margins of the hooks, so that when the manual flexing force on the edge portions 132 and 133 is released, the structural bias of the shelf portions will pull the retaining hooks apart and the end edge portions of the receiving slots 119b will be received and engaged in the channels defined by the retaining hook portions 137a to retain the shelf portion 130 on the first member 111. In an exemplary embodiment a support flange 139, best shown in FIG. 2B, may be unitarily formed with the shelf portion 130 and extend downwardly from the back edge of the bottom portion 131 a desired distance to provide additional support and resistance to downward bending of the retained shelf portion. In addition, shelf portions 130 may be coupled to mounting support portion 110 with a retaining member (not shown). A suitable retaining member may include, but is not limited to, a screw, bolt, pin, or any other suitable removable engagement member. A retaining member may be received by one or more retaining apertures 138, and the corresponding shelf attachment member aperture 122 aligned with each retaining aperture 138. While a particular advantageous engagement structure has been illustrated and described for mounting a shelf portion on the first member 111 such that any single shelf member may be attached to or detached from a mounting support assembly without interference with any other mounted shelf portion, it should be understood that any mechanical connection of shelf portions to support assembly is contemplated within the spirit of the invention.

Tower assembly 100 may also include a cable management system. The cable management system may include cable management channel 116, which may be provided in assembly 100 to assist in the management of any cables, such as cables provided for supplying power to one or more electronic devices, cables provided for the exchange of data with one or more electronic devices, or any other associated cable to be coupled to one or more electronic device while stored in storage bays 160. Referring to FIGS. 1 and 3, channel 116 may extend vertical along the majority of mounting support portion 110, up to and including the entirety of the vertical structure of mounting support portion 110. Referring now to FIGS. 4 and 5, channel 116 may include a first cable support aperture 120 provided in second member 112 or third member 113. As illustrated, both second and third members 112, 113 each have a first cable aperture or first cable aperture 120 which corresponds to each shelf portion 130. As such, second and third members 112, 113 each have a plurality of cable apertures 120 which extend along second and third members 112, 113, respectively. The plurality of cable apertures 120 may be provided vertically along second and third members 112, 113 and may be provided in approximately vertical alignment. Channel 116 may also include a plurality of second cable apertures 121 provided in second member 112 or third member 113. As illustrated, both second and third members 112, 113 each have a pair of appropriately sized second cable apertures 121 which corresponds to each shelf portion 130. As such, second and third members 112, 113 may each have a plurality of second cable aperture 121 pairs which correspond to each shelf portion 130. The plurality of second cable aperture 121 pairs may be provided vertically along second and third members 112, 113 and may be provided in approximately vertical alignment. In addition, channel 116 may include one or more master or third cable apertures 123 provided in second member 112 and/or third member 113. Third cable apertures 123 may be provided to allow one or more supply cables, for example, but not limited to, a main power cable and/or main communication cable, entry into channel 116. The second cable apertures 121 may have a diameter which is less than first and third cable support apertures 120, 123. In addition the third cable apertures 123 may have a diameter which is greater than first and second cable apertures 120, 121. In one or more examples of embodiments, channel 116 may have a polygonal, arcuate, tubular, rounded, or any other desired or suitable cross-sectional shape suitable to manage one or more cables.

The cable management system may also include one or more shelf apertures 140, 141 provided in each shelf portion 130. Referring to FIGS. 4 and 5, at least one first shelf aperture 140 may be provided in first or second edge portions 132, 133. As illustrated, at least one first shelf aperture 140 may be provided in each of first edge portion 132 and second edge portion 133, respectively. First shelf apertures 140 provided in first and second edge portions 132, 133 may be in lateral or horizontal alignment and separated by bottom portion 131. However, in one or more examples of embodiments, first shelf apertures 140 provided in first and second edge portions 132, 133 may not be in alignment and otherwise may be provided in any desired location along the respective first or second edge portion 132, 133. Referring to FIG. 2, at least one second shelf aperture 141 may be provided in first or second back tabs 134, 135. As illustrated, at least one second shelf aperture 141 may be provided in each of first back tab 134 and second back tab 135, respectively. Second shelf apertures 141 provided in first and second back tabs 134, 135 may be in lateral or horizontal alignment. However, in one or more examples of embodiments, second shelf apertures 141 provided in first and second back tabs 134, 135 may not be in alignment and otherwise may be provided in any desired location along the respective first or second back tabs 134, 135. Generally, second shelf apertures 141 are provided in a different plane than first shelf apertures 140. As illustrated, second shelf apertures 141 may be provided in a plane orthogonal to the plane first shelf apertures 140 are provided in. In addition, second shelf apertures 141 are generally provided at a location in each respective first and second back tabs 134, 135 which is not in alignment or is not overlapping or otherwise is offset from first member 111 of tower support 110. This allow one or more cables to extend from channel 116 through one or more of the second shelf apertures 141 of each shelf portion 130.

Referring back to FIGS. 4 and 5, a plurality of third shelf apertures 142 may be provided in first or second edge portions 132, 133. As illustrated, at least two third shelf apertures 142 may be provided in first edge portion 132 and second edge portion 133, respectively. Third shelf apertures 142 provided in first and second edge portions 132, 133 may be in lateral or horizontal alignment along each edge portion 132, 133. In addition, each pair of third shelf apertures may be in lateral or horizontal alignment and separated by bottom portion 131. However, in one or more examples of embodiments, third shelf apertures 142 provided in first and second edge portions 132, 133 may not be in alignment and otherwise may be provided in any desired location along the respective first or second edge portion 132, 133. Generally, third shelf apertures 142 may have a diameter which is less than first and second shelf apertures 140, 141.

In operation and use of the cable management system, one or more cables may enter into channel 116 through third cable aperture(s) 123. The cables may then extend along channel 116. One or more cables may exit channel 116 to each respective shelf portion 130 through one or more of first cable support aperture(s) 120. After exiting channel 116, one or more cables may extend to each shelf portion 130 through one or more of first and second shelf aperture(s) 140, 141. Whether to use one or more of first and second shelf aperture(s) 140, 141 depends upon a number of factors, including, but not limited to, the number of cables extending outward from channel 116 to each shelf portion 130, the location of a power adaptor for charging an electronic device within the electronic device, and/or the location of a communication adaptor within the electronic device for communicating with the electronic device. The plurality of first and second shelf aperture(s) 140, 141 advantageously provide alternatives for extending one or more cords from channel 116 to electrically connect to the electronic device(s) stored in each shelf portion 130. This will accommodate different types, configurations, and/or brands of electronic devices which may have different locations for various ports which would receive one or more cables. It should be appreciated in one or more examples of embodiments that more than one device may be stored in each shelf portion. In addition, more than one type or brand of device may be stored in any one shelf portion, including two or more different types or brands of device in a single shelf portion at the same time. In addition, more than one type or brand of device may be stored simultaneously in separate shelf portions of a single assembly.

In addition, second cable apertures 121 and third shelf apertures 142 may be provided to assist in coupling or restraining various add on hardware components associated with the electronic devices. For example, chargers for electronic devices typically have a power supply, which may be sizeable. Second cable apertures 121 and/or third shelf apertures 142 provide a location in which these components may be coupled to the respective channel 116, second member 112, third member 113, and/or shelf portion 130. Second cable apertures 121 and/or third shelf apertures 142 may receive a connecting member, for example, but not limited to, a zip tie, twist tie, or other attachment apparatus. This will allow for one or more hardware components associated with each electronic device to be coupled to assembly 100. In one or more examples of embodiments, one or more of the disclosed apertures of the cable management system may be used to receive one or more data distribution cables. A data distribution cable may include, but is not limited to, a USB cable, mini-USB cable, Firewire, CAT-5, CAT-6, or any other known or future developed structure or material which communicates or transfers data. A plurality of data distribution cables may be incorporated into the cable management system to create data links with one or more portable device(s) stored in the tower assembly. This advantageously allows for the wired transfer and/or distribution of data to or from one or more data source(s) from or to one or more portable device(s) stored in the tower assembly. In addition, in one or more examples of embodiments, one or more portable device(s) stored in the tower assembly may be in wireless communication with one or more data source(s) to allow for the wireless transfer and/or distribution of data to or from one or more data source(s) from or to one or more portable device(s) stored in the tower assembly.

FIGS. 6 and 7 illustrate one or more examples of embodiments of assembly 100 incorporating a power supply or power strip or power distribution strip 117 into channel 116. Power strip 117 may be provided in channel 116. In addition, power strip 117 may be coupled to first member 111. Power distribution strip 117 may distribute electricity to a plurality of outlets 118 provided within the strip. The number of outlets generally corresponds to at least the number of shelf portions 130 which may be coupled to or available to be coupled to mounting support portion 110. In addition, the power strip may be provided with one power inlet. This advantageously allows for the power strip to use and/or occupy only a single power receptacle. It should be appreciated that mat type chargers, which may re-charge an electronic device by placement of the electronic device onto the mat, may be utilized by assembly 100. Specifically, one or more mat type chargers may be provided in each storage bay 160 on each bottom portion 131 within each shelf portion 130. Examples of commercially available mat type chargers include POWERMAT brand wireless battery chargers sold by Powermat Ltd. of Neve Ilan, Israel.

FIGS. 4 and 5 illustrate one or more locking slots 143 provided in each shelf portion 130. Locking slots 143 may be provided between first edge portion 132 and bottom portion 131, and between second edge portion 133 and bottom portion 131. Slots 143 may be any suitable or desirable length, shape, or size, and may be respectively defined by the removal of a portion of each edge portion 132, 133 and/or associated bottom portion 131. Slots 143 may be adapted to receive a portion of a locking assembly to lock or assist in restricting access to one or more electronic devices stored in each shelf portion 130.

FIGS. 8-12 illustrate tower assembly 100 incorporating one or more examples of embodiments of a locking assembly 150. Locking assembly 150 may include a first sidewall or top sidewall 151 which is provided over a portion of the top most shelf portion 130. Preferably, top sidewall 151 preferably is of a size to limit access and/or removal of an electronic device stored in the top most shelf portion 130. As such, top sidewall 151 may cover or overlap the entire storage bay 160 or may cover or overlap less than the entirety of storage bay 160. Top sidewall 151 may be coupled or integrally connected to opposing second and third outer sidewalls 152, 153. Sidewalls 152, 153 may extend vertically from the top sidewall 151 through locking slots 143 of each shelf portion 130. Sidewalls 152, 153 have a width, as measured along the edge portions 132, 133, sufficient to limit access and/or removal of electronic devices stored in each shelf portion 130 along the edge portions 132, 133. Sidewalls 152, 153 extend from the top most shelf portion 130 to the bottom most shelf portion 130. At the bottom most shelf portion 130, each sidewall 152, 153 may be coupled to the bottom most shelf portion 130. In addition, each sidewall 152, 153 may be coupled to each shelf portion through third shelf apertures 142. For example, each sidewall 152, 153 may be welded, bolted, pinned, or otherwise connected to each shelf portion 130 through third shelf apertures 142. Door 154 may be pivotably connected to either sidewall 152, 153. As illustrated, door 154 is pivotably connected to sidewall 152 by a plurality of hinge members 155. Door 154 pivots about hinge members 155 to provide access to the shelf portions 130 and associated electronic devices stored therein. Door 154 is selectively coupled to a locking member 156 by a locking handle 157. Locking member 156 may be coupled to or otherwise attached to one of the shelf portions 130. Preferably, locking member 156 is permanently attached, such as by weld, to a bottom portion 131 of at least one shelf portion 130. The locking member 156 extends from the associated shelf portion 130 towards door 154. Locking member 156 has locking handle 157 at an end closest to door 154. Locking handle 157 is adapted to engage door 154 to enable engagement and locking of door 154 to locking member 156. This facilitates selective opening, closing, and locking of door 154 in order to limit access to one or more electronic devices stored within each associated shelf portion 130. The locking assembly 150 advantageously provides safeguards limiting the unauthorized removal or taking of one or more electronic devices from assembly 100 while also providing sufficient open space between each of the shelf portions 130 and the locking assembly 150 to allow a user to visually inventory the electronic devices stored in assembly 100 while the locking assembly 150 is in a locked position. In one or more examples of embodiments, a plurality of doors 154 may be pivotably connected to the sidewalls 152, 153. For example, a first door 154 may be pivotably connected to sidewall 152, while a second door 154 may be pivotably connected to sidewall 153.

FIGS. 13-14 illustrate an alternative example of an embodiment of a tower assembly 100. More specifically, FIGS. 13-14 illustrate a double wall unit tower assembly 200. Particular components described herein are substantially the same and like numbers have been used to illustrate the like components. Referring to FIGS. 13-14, double wall unit tower assembly 200 includes a double mount support portion 210. Double mount support portion 210 includes a dual channel arrangement for supporting a plurality of shelf portions 130 provided in two, side by side, stacked, vertical rows. As illustrated, double mount support portion 210 includes a first channel 216 and a second channel 226. The first and second channels 216, 226 are substantially identical to channel 116, other than channels 216, 226 are connected by member 222.

Figure 15:
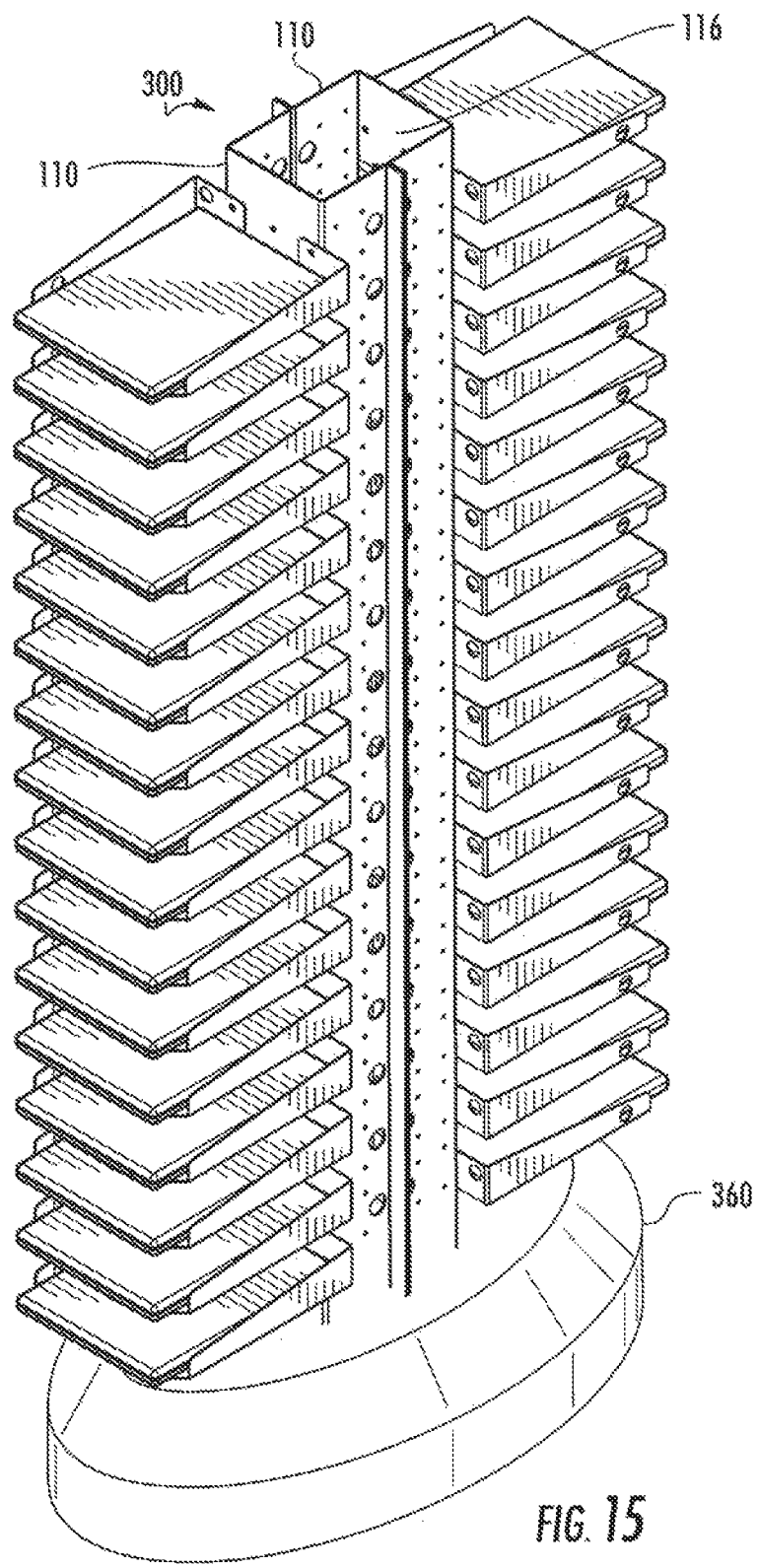
FIG. 15 is an isometric view of one or more examples of embodiments of a storage and charging station system for portable electronic devices, wherein the system includes multiple rows of vertically spaced shelves and a semi-static base.

FIG. 15 illustrates an alternative embodiment of a tower assembly 100. More specifically, FIG. 15 illustrates a double unit back to back tower assembly 300 having a semi-static base 360. Particular components described herein are substantially the same and like numbers have been used to illustrate the like components. Tower assembly 300 is made of two opposing tower supports 110, wherein the respective channel portions 116 are coupled or combined to form a single central channel.

Figure 16:
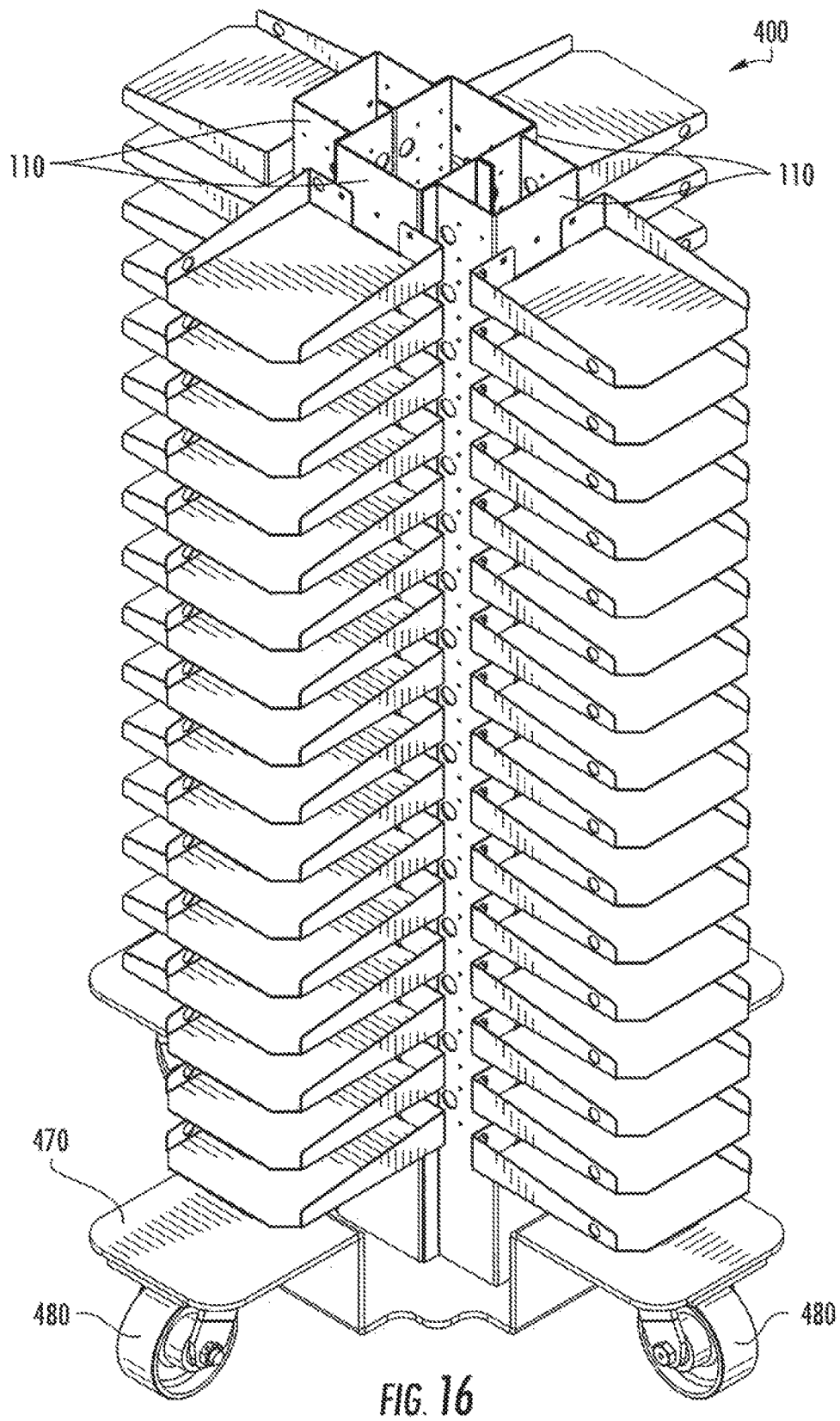
FIG. 16 is an isometric view of one or more examples of embodiments of a storage and charging station system for portable electronic devices, wherein the system includes multiple rows of vertically spaced shelves and a mobile base.

FIG. 16 illustrates an alternative embodiment of a tower assembly 100. More specifically, FIG. 16 illustrates a quad unit tower assembly 400 which is mobile by being provided on a base 470 having wheels or casters 480 attached thereto. Particular components described herein are substantially the same and like numbers have been used to illustrate the like components. Tower assembly 400 is made of four separate tower supports 110 connected together, wherein the respective channel portions 116 are combined to form three separate central channels.

Figure 17:
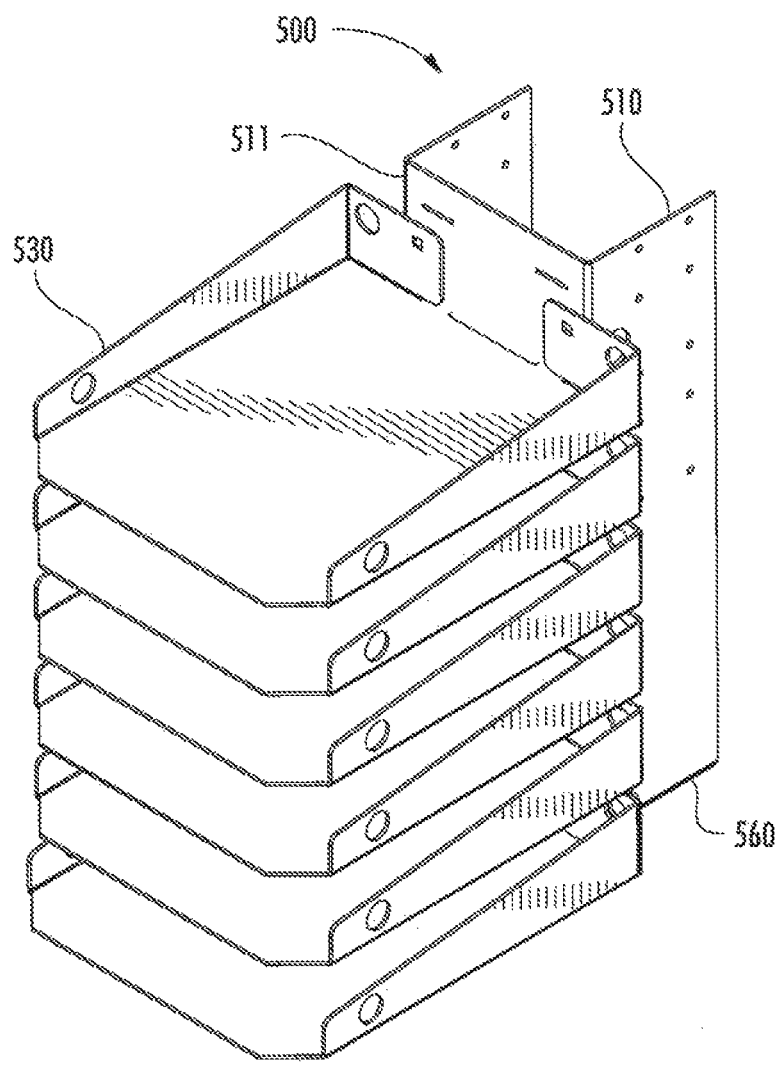
FIG. 17 is an isometric view of one or more examples of embodiments of a counter top storage and charging system for portable electronic devices, wherein the system includes a plurality of vertically spaced shelves.
Figure 18:
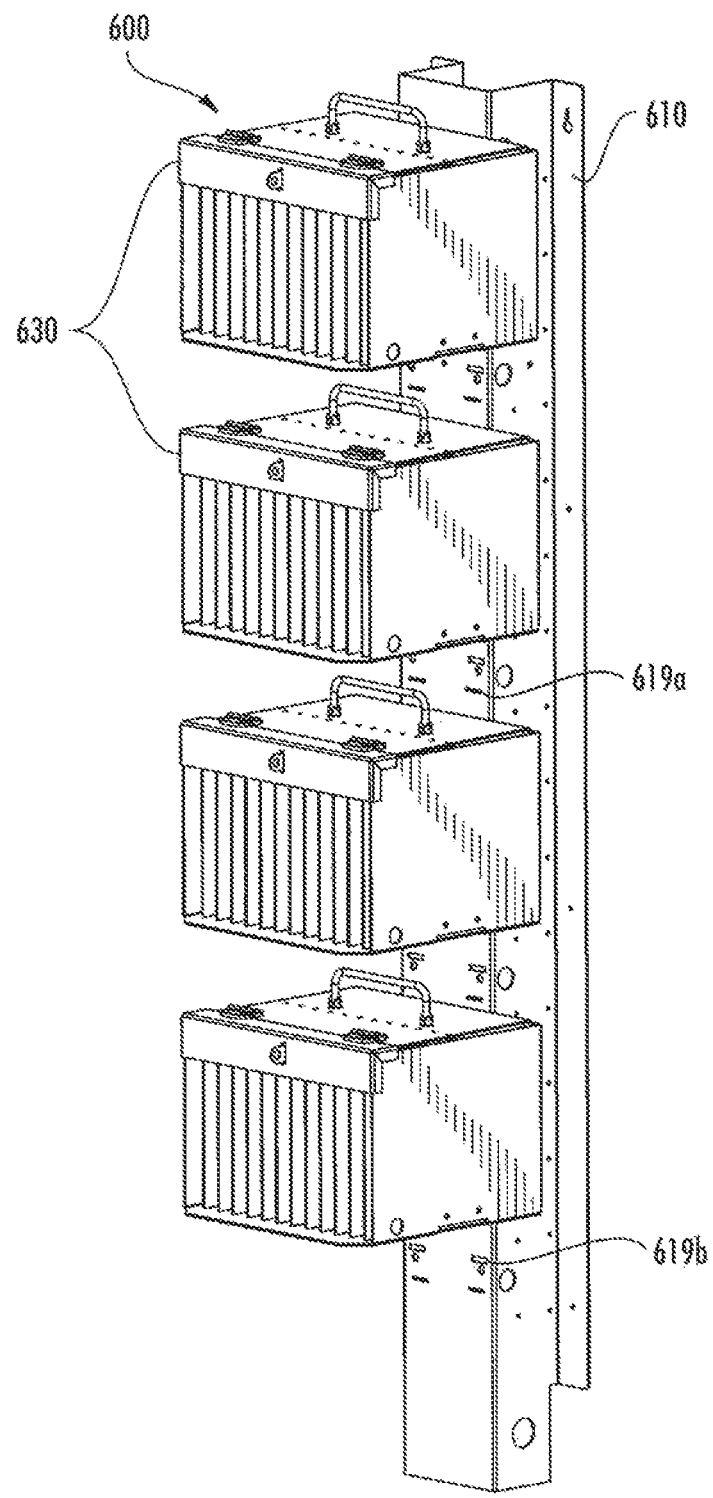
FIG. 18 is an isometric view of one or more examples of embodiments of a plurality of portable carrier storage and charging assemblies, each carrier being adapted to contain a plurality of portable electronic devices, which assemblies are detachably mounted on a tower assembly of the invention.
Figure 19:
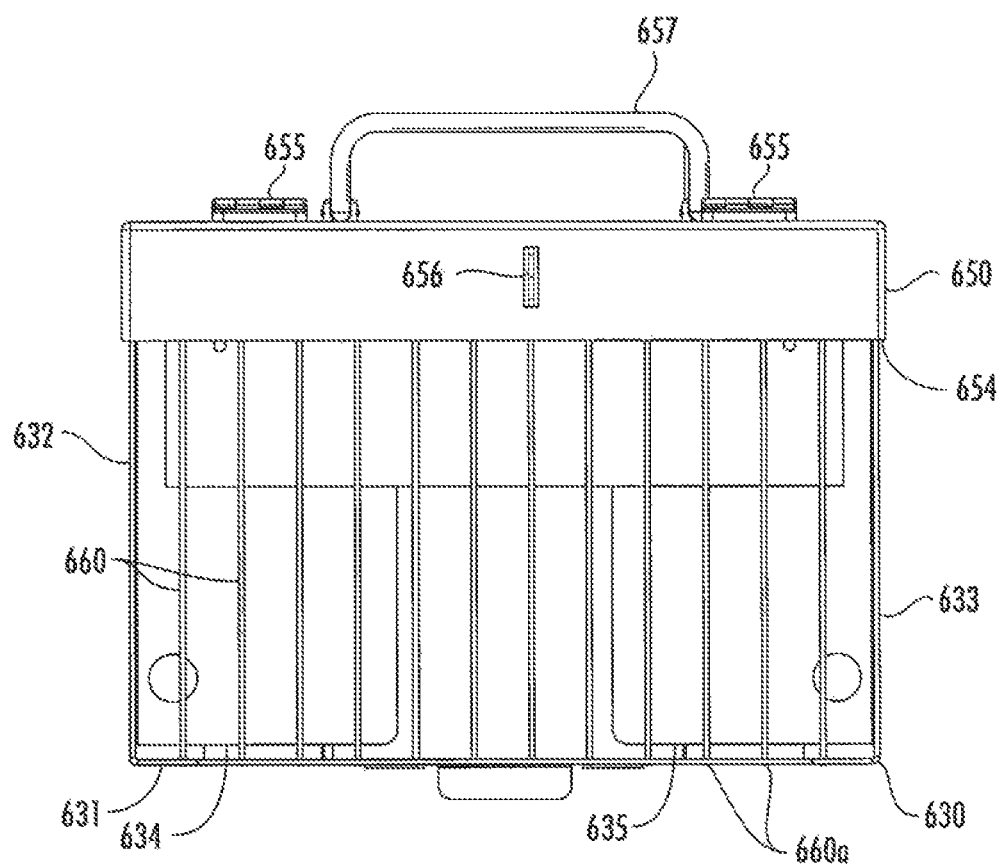
FIG. 19 is a front elevation view of a portable carrier storage and charging assembly of FIG. 18 detached from a tower assembly.

FIG. 17 schematically illustrates an alternative embodiment of a counter top assembly of a storage and charging station system for portable electronic devices. More specifically, FIG. 17 illustrates a counter top assembly 500 which may be located on a counter top, desktop, shelf or any other convenient horizontal support surface. A base is provided which includes a vertical channel support member 510 having a horizontal base 560 suitable for sitting or mounting on a support surface, and a plurality of shelf portions 530 attached in spaced vertical relation to the channel support member 510. Particular components described herein may be substantially the same as similarly functioning components previously described herein and like numbers have been used to illustrate the like components. The channel support member 510 includes a first member 511 which may be fabricated to support the shelf portions 130, 530 in the same manner as previously described first member 111. Likewise, other equivalent attachment means may be provided on the shelf portions 530 and the first member 511 to detachably secure the shelf portions 530 to the channel support member 510 in vertically spaced relation for convenience of use. The channel support member 510 can be provided with a properly sized power distribution strip (not shown) of the same type illustrated and described above, or any other suitable available or future developed multiple outlet power source. Likewise, mat type chargers as previously described may be provided. A rear cover plate (not shown) and/or top cover plate (not shown) of any suitable configuration may be provided for the channel support chamber 510 if desired.

FIGS. 18-21 illustrate examples of an alternative embodiment of a storage and charging station system 600, which includes a plurality of modular portable carrier storage and charging assemblies 630 detachably mounted on a support portion 610, which may be substantially similar in structure to support portion 110 or other support portions previously described. Each portable carrier assembly 630 is independently attachable to and detachable from support portion 610 in the same general manner as shelf portions 130. Similar attachment structure and multiples thereof may be provided on each portable carrier assembly 630 as on previously described shelf portions 130, and such attachment structures can be spaced to fit respectively similarly spaced first shelf retaining slots 619a and 619b. Likewise, support structure 610 may be slotted to receive and support previously illustrated and described shelf portions 130 in vertically spaced array.

Figure 20:
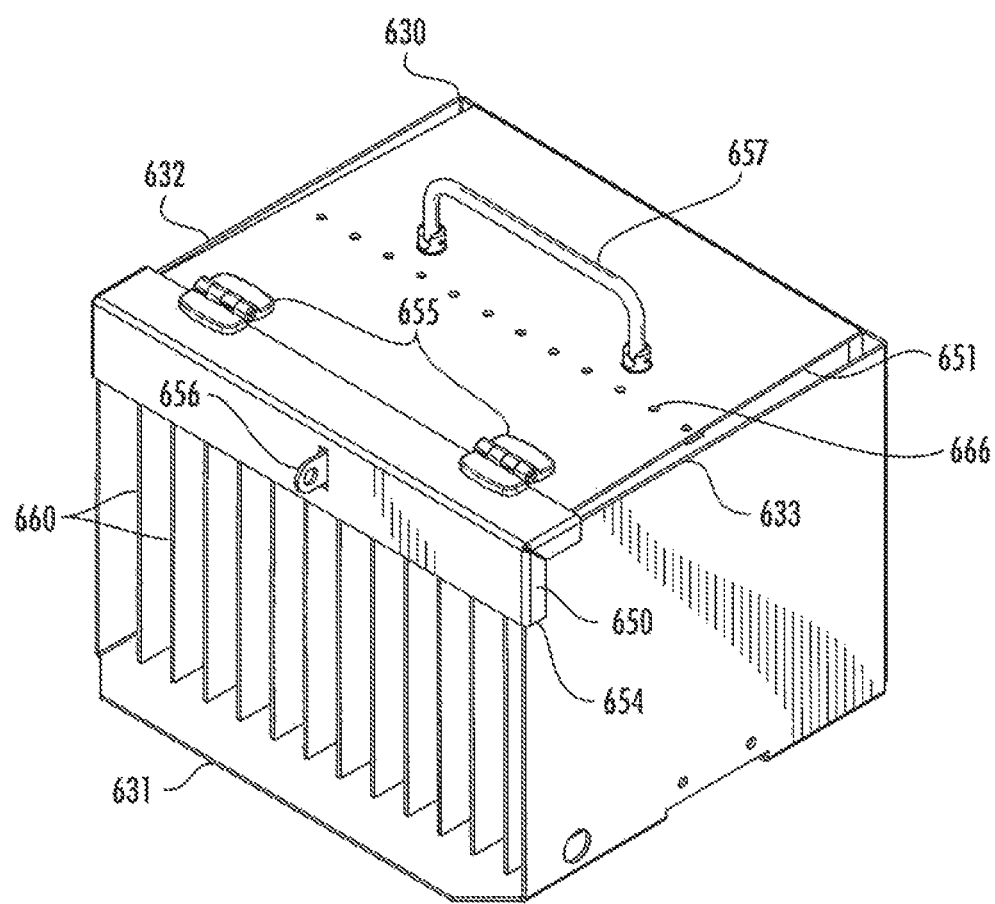
FIG. 20 is an isometric view showing the front, right and top sides of the portable carrier storage and charging assembly of FIG. 19.
Figure 21:
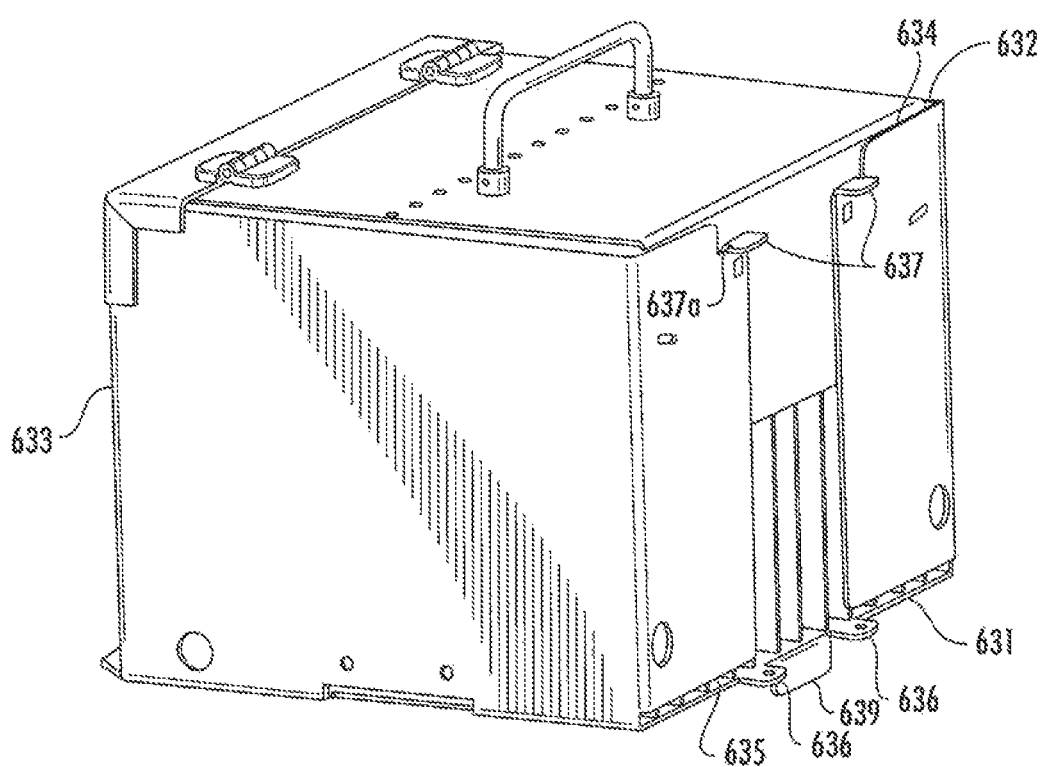
FIG. 21 is an isometric view showing the rear, right and top sides of the portable carrier storage and charging assembly of FIG. 19.

Referring to FIG. 20, it is seen that the exemplary portable carrier assembly 630 has first side portions 632 and second side portions 633 which may be unitarily formed with the assembly bottom portion 631 to permit the side portions 632 and 633 to be flexed inwardly in the same manner as the previously described edge portions 132 and 133 of the shelf portions 130. FIG. 21 illustrates that the illustrated carrier assembly has a first back panel 634 and a second back panel 635 which may respectively be formed from a portion of the first side portion 632 and second side portion 633, and supported thereby in the same manner as the previously shown and described back tabs 134 and 135. In addition, it is seen from FIG. 21 that the portable carrier assembly bottom portion 631 may have retaining tabs 636 projecting from its back edge in the same manner as retaining tabs 136, and a support flange 639 extending downwardly a desired distance from its back edge in the same manner as support flange 139, all as previously illustrated and described herein. Likewise, first back panel 634 and second back panel 635 have retaining hooks 637 with hook portions 637a similar to the retaining hooks 137 and 137a previously shown and described herein. Thus, it can be readily seen that the portable carriage assembly 630 can be easily attached and detached from the support portion 610 in the same manner as described with respect to the attachment of the shelf portions 130 to the support portion 111.

Referring to FIG. 20, it can be seen that the portable carrier assembly 630 has a plurality of partitions 660 extending vertically from the carrier bottom portion 631 to the carrier top portion 651, and spaced to provide a plurality of vertical compartments 662 between the partitions 651 and adjacent partitions and side portions 632, 633 for the segregated containment of a plurality of portable electronic devices. The partitions 660 may be secured to the top portion 651 and the bottom portion 631 by pins 660*a* (shown in FIG. 19) extending into slots or holes 666 in the top portion 651 and bottom portion 631 of the carrier assembly, or by any other equivalent or alternate structure, including adhesive, welding, fasteners or other known sheet metal attachment structure.

FIG. 20 further illustrates a locking assembly 650 for securing portable electronic devices within the carrier assembly 630. A closure member 654 may be hingedly attached to the top portion 651 of the carrier assembly 630. The closure member 654 may consist of an right angle strip connected by a plurality of hinges 655 to the top portion 651 such that it will pivot to a position with one side of the angled strip lying parallel to the top portion 651 and the other side of the angled strip extending vertically across the front of the carrier assembly 630. A staple 656 may extend from one or more partitions or other interior structure through a slot in the vertically extending portion of closure member 654 to receive a padlock or other common locking device (not shown) to prevent withdrawal of portable electric devices from the carrier during periods of storage. The vertical side of the closure member may be extended as far as necessary to prevent removal of a smaller portable electronic device. Alternatively, a mesh panel (not shown) may be extended from the vertical side of the closure member to cover the entire front of the carrier assembly without blocking the interior from view to prevent removal of small electronic devices such as smart phones. It will be seen that other equivalent structure may be employed to selectively secure the contents within the compartments of the carrier as may be desired, with or without visual access to the contents of the carrier, and to be pivotally or otherwise opened to permit removal of the electronic devices for use.

Finally, a handle 657, which may be foldable to permit closer vertical spacing of the portable carrier assemblies on the support member 610, may be provided to facilitate transport of the portable carrier assembly 630 to different locations for use by designated users. The carrier assembly 630 may further be provided with power strips or wireless battery chargers (not shown) so that the portable electronic devices may be charged at user locations remote from the support member 610.

In operation and use of the tower assemblies 100, 200, 300, 400, 500, 600 a large number of portable electronic devices 50 may be stored at the respective tower assemblies. The devices 50 can then be distributed as needed, for example to students, employees, or to individuals who check the devices out for a period of time. When returned, the devices 50 can be returned to their corresponding shelf portion 130. The devices may subsequently be stored in the tower assembly 100, 200, 300, 400, 500, 600, and the associated batteries may be charged or recharged.

The devices 50 may have indicia for identification, such as a number, name, code, and/or identifying color. The indicia may correspond with an associated indicia provided on one or more of the shelf portions 130. This further assists facilitation of "command and control" of the devices 50, as a person responsible for the devices 50 can quickly inventory devices 50, determine if all of the devices are in or out at any given time, or determine which device 50 is not present in the assembly 100, 200, 300, 400, 500, 600.

In addition, devices 50 may each have remote device monitoring hardware and/or software provided thereon. The device monitoring hardware and/or software may monitor the location of each device 50. In addition, or in the alternative, device monitoring hardware and/or software may monitor whether each device 50 is returned to the correct corresponding shelf portion 130 of assembly 100, 200, 300, 400, 500, 600 after use of the device 50.

FIGS. 22-31*a* illustrate several alternative exemplary embodiments of improved storage management systems for electronic devices.

Figure 22:
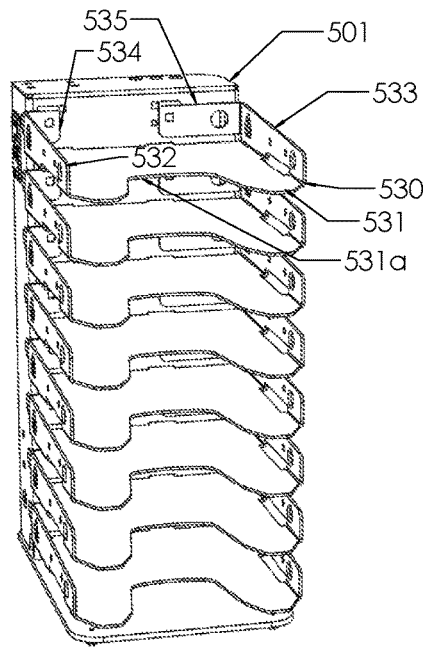
FIG. 22 is a front-side isometric view of an exemplary embodiment of a storage and charging station system adapted to sit on a desktop and having an exemplary vertical tower support with projecting shelves with open cutout areas to facilitate hand removal of electronic devices which may be supported by the shelves.
Figure 23:
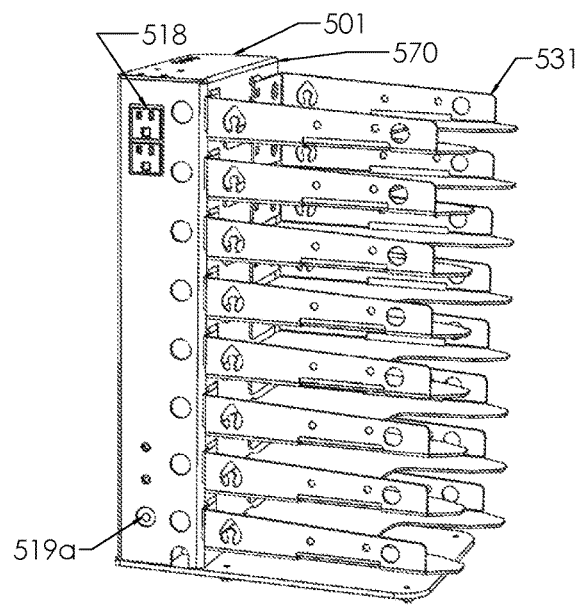
FIG. 23 is a isometric side view of the storage and charging station system of FIG. 22.

FIGS. 22-27 are photographs of an improved counter top assembly embodiment 501 of the improved storage management system for electronic devices. FIGS. 22 and 23 show front views of the embodiment having an improved shelf structure. The improved embodiment has a shelf 531 having a first edge portion 532, second edge portion 533, first back tab 534, second back tab 535, and bottom portion 531. At the front portion of various embodiments of the improved shelf 531, the bottom portion 531 has a first length that extends beyond the front end of the respective edge portions 532 and 533 at its angle of intersection with the edge portions. At the mid-portion between the first and second sides of the shelf structure, the bottom portion 531 has a second, shorter length that is approximately two-thirds of the length of the edge portions as measured from the back tabs 534 and 535 of the shelf. This length extends centrally for approximately half of the width of the bottom portion 531. Between the first length and second length, the shelf bottom portion length tapers rearwardly. The result is that the front margin of the base defines an approximately U-shaped cutout 531*a* or open area from the front of the shelf. This U-shaped cutout is properly sized for a hand to be able to easily and simultaneously grip both the upper and lower surfaces of an electronic device to facilitate its easy insertion in and removal from the shelf 530 or the improved storage management system.

Figure 27:
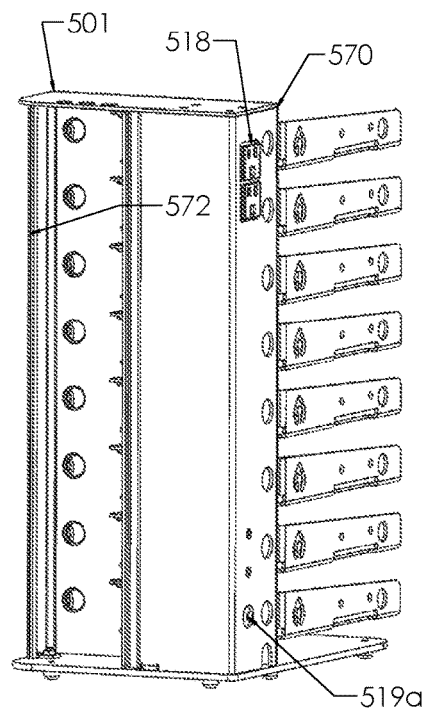
FIG. 27 is an isometric right rear view of another exemplary embodiment of the invention wherein a rear access panel is removed from the vertical tower support to permit visual access to the interior of the tower support.

It should be understood that exemplary embodiments of the improved storage management system for electronic devices using the improved shelf structure may include shelves 530 of differing sizes but provided in connection with the same tower structure. The differing shelves may be provided to better accommodate varying sizes of devices. For example, a user may want to have a spot for a full-size laptop and for a tablet or other smaller device. In various embodiments, the user may select the sizes of shelves provided in the structure according to the user's various device-driven needs. As shown in FIGS. 22, 23 and 27 shelves 530 of any size may snap into the tower assembly channel support 570 through slots and retaining tab and retaining hook systems provided as described above with reference to FIGS. 2-7, or be connected by other suitable fastener means (not shown).

Figure 25:
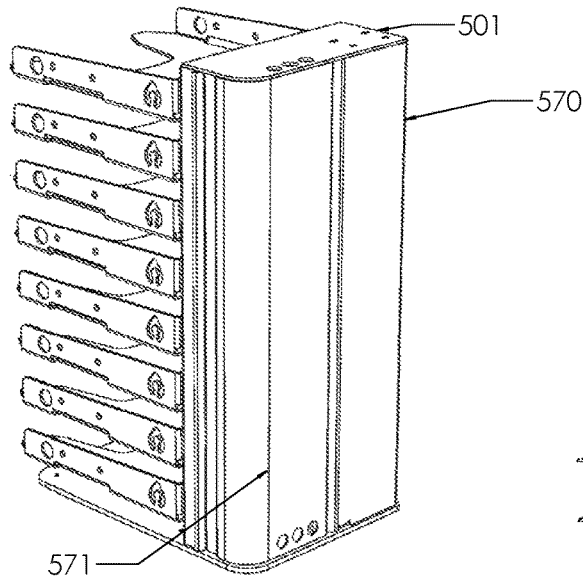
FIG. 25 is an isometric back side view of the storage and charging station system of FIG. 22.

FIGS. 23, 25, 26, 30 and 31 also show accommodating structure for an improved cable management system. FIG. 25 shows that in various embodiments, the cable management system may include a vertical channel support 570 having a rear corner access panel 571 attached to the vertical tower support in spaced relation behind the front wall of the tower support access panel. The access panel 571 may be comprised of a rounded piece of metal having apertures. The apertures may have several functions including providing air circulation to the charging devices. The cable management access panel 571 may be removably coupled to the tower vertical channel support 570 in various ways, including snap-fit engagement of the respective engaging margins of the coupled panel and tower channel support 570. For example, the cable management access panel may snap into the tower support over bent tower channel support edge features 572 shown in FIGS. 26 and 27.

Figure 26:
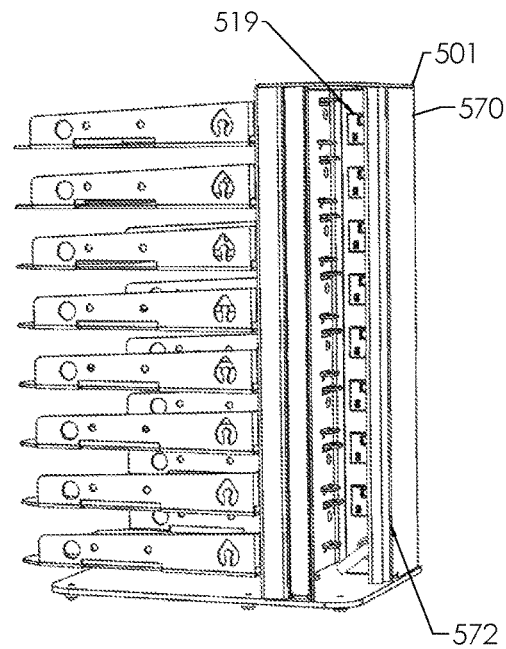
FIG. 26 is an isometric left rear side view of the storage and charging station system of FIG. 22, wherein a rear corner access panel is removed from the vertical tower support to permit visual access to the interior of the tower support.
Figure 28:
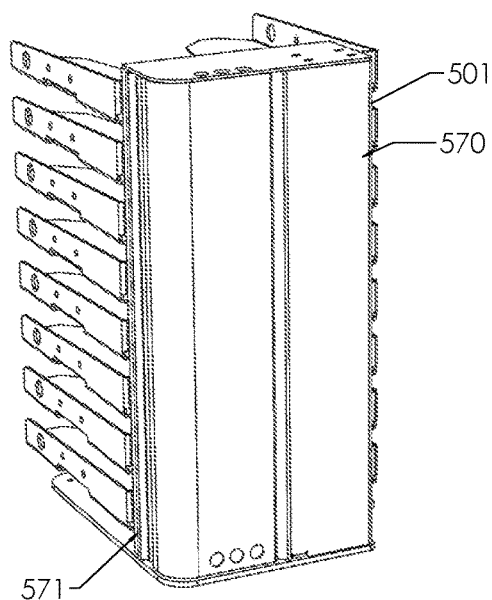
FIG. 28 is an isometric left rear view of the embodiment of FIG. 27 with the rear corner access panel in place on the tower support.

As can be seen in the exemplary embodiments disclosed in FIGS. 27 and 28, the improved storage management system may have an improved cable management system facilitated by cable apertures provided on the back or side of the tower support, as well as in various shelf aperture locations along the side and back walls of the shelves. In various embodiments, the improved cable management system may include a power distribution strip 519 provided inside the access panel of the tower support, as shown in FIG. 26. The power strip 519 may have auxiliary externally facing power distribution sockets 518 accessible to the outside through a rectangular or other shaped opening in the side wall near the top of the tower support 570, and an on/off and/or indicator switch 519a accessible or visible through a switch/indicator aperture near the bottom of the side wall, as shown in FIGS. 23 and 27.

Figure 29:
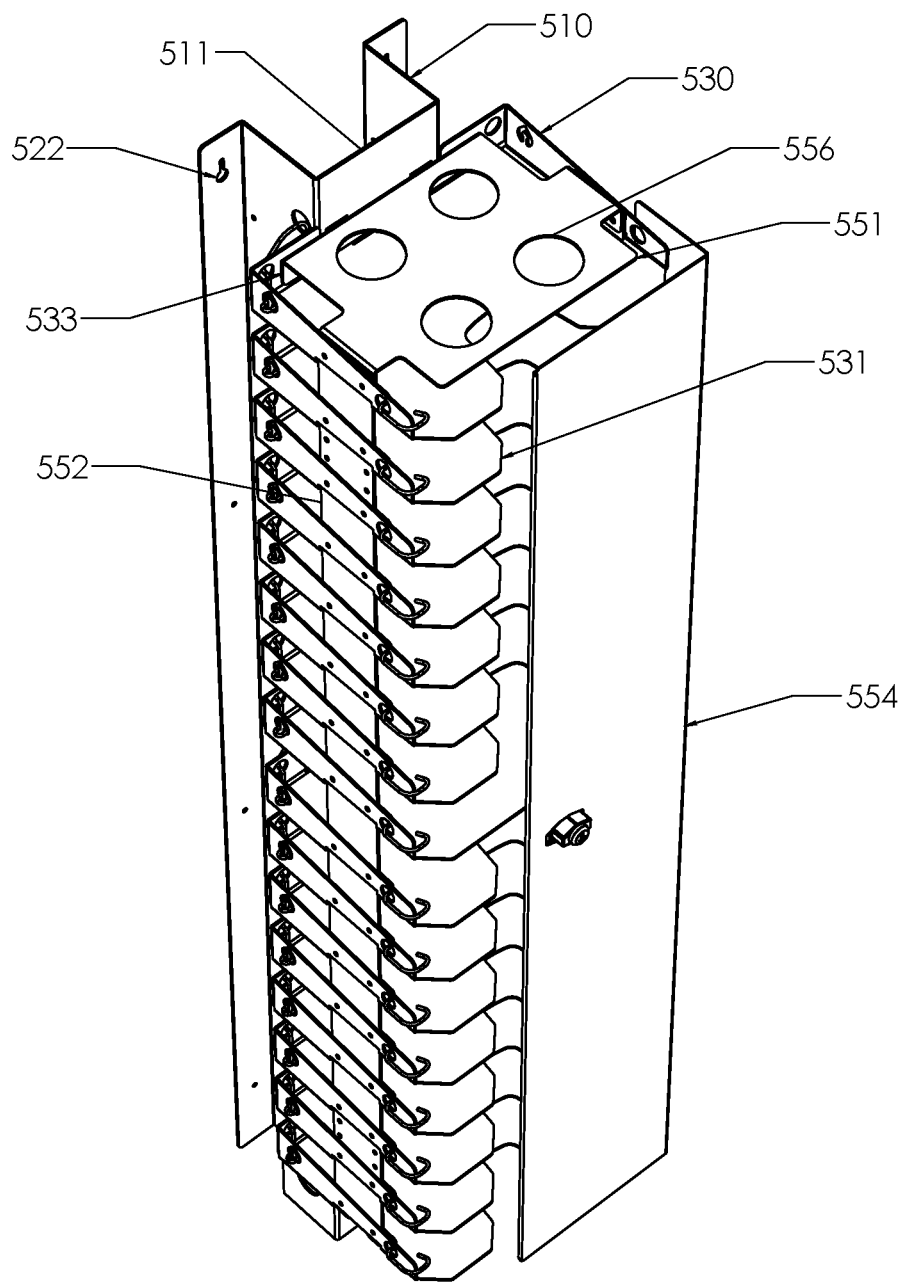
FIG. 29 is a top perspective view of an exemplary improved embodiment of the invention.

As shown in FIGS. 22-29, the illustrated and described exemplary embodiment of the improved storage management system is well-adapted to sit independently and securely on any horizontal support surface. Like the embodiments of the storage and management systems variously shown in FIGS. 1-16, the improved storage management system tower support may be quite tall, permitting the tower to be secure when set on a floor with mounting apertures 522 as shown in FIG. 29 for fastening by screws or other fasteners to a permanent structure such as a wall or other vertical support member. If there is a need for a tall storage management system to be located either semi-permanently or movably in a free-standing location, a support stand having a horizontally extending base with a support structure extending vertically from the base may be utilized. For example, a support stand having an optionally split base with plural base segments connected in spaced relation to provide a valley of sufficient width to receive the lower end of a tower support 510 may be utilized. Such plural base segments can be weighted or dimensioned in any suitable manner to provide vertical stability for the vertical support structure and a connected tall storage management system. Alternatively, such a base may have a continuous base segment, with the tower support seated directly thereon. In addition, the base may include appropriately sized support wheels and/or casters, as generally shown FIG. 16, to permit the support stand, with or without the attached storage management system, to be moved from place to place for convenient access or storage, as desired. Of course, when the connected storage management system is to be used for storage and charging of electronic devices it must be located with access to at least one suitable power outlet.

Figure 24:
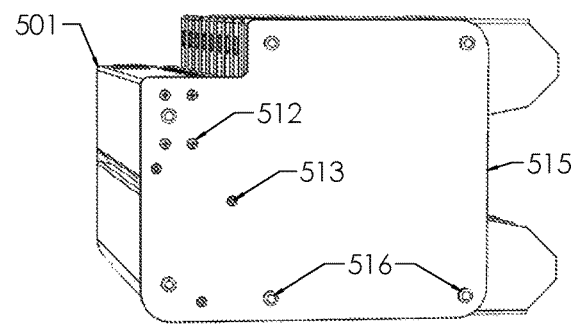
FIG. 24 is an isometric view of the bottom of a base for a charging and storage system of the type shown in FIGS. 22-28.
Figure 33:
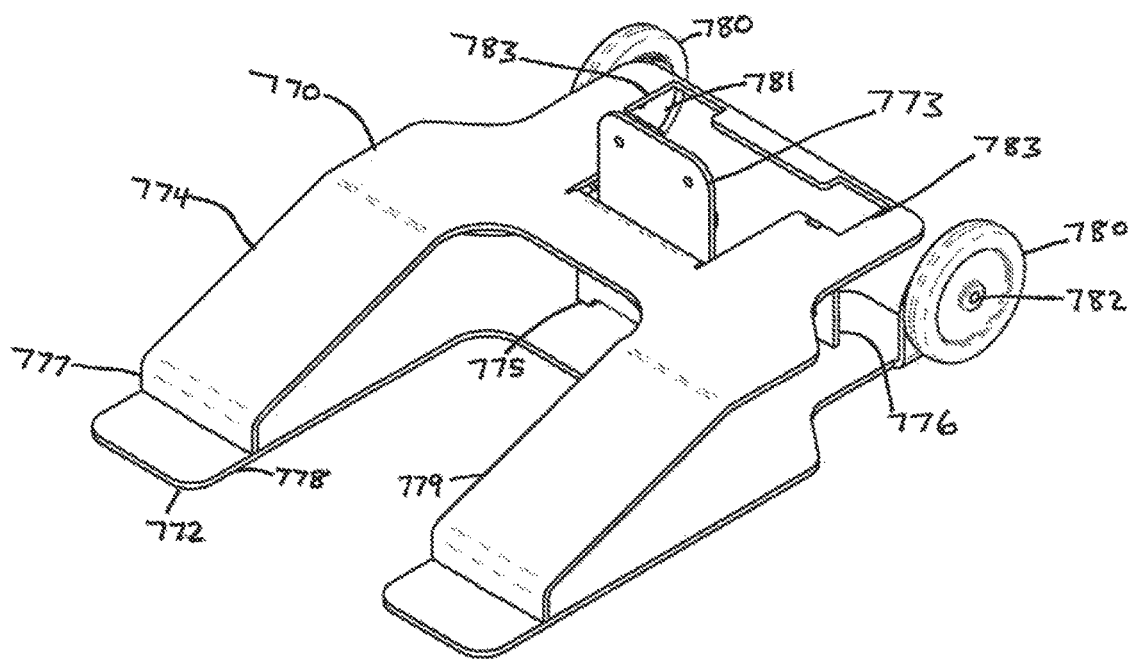
FIG. 33 is an isometric view of the mobile base unit for the improved mobile storage and charging station of FIG. 32.
Figure 34:
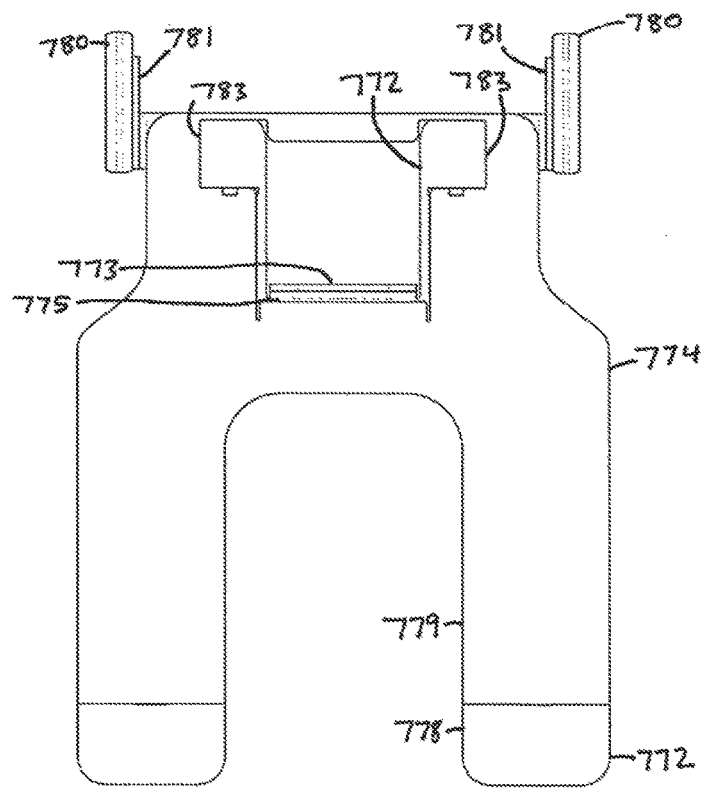
FIG. 34 is a top plan view of the mobile base unit of FIG. 33.
Figure 35:
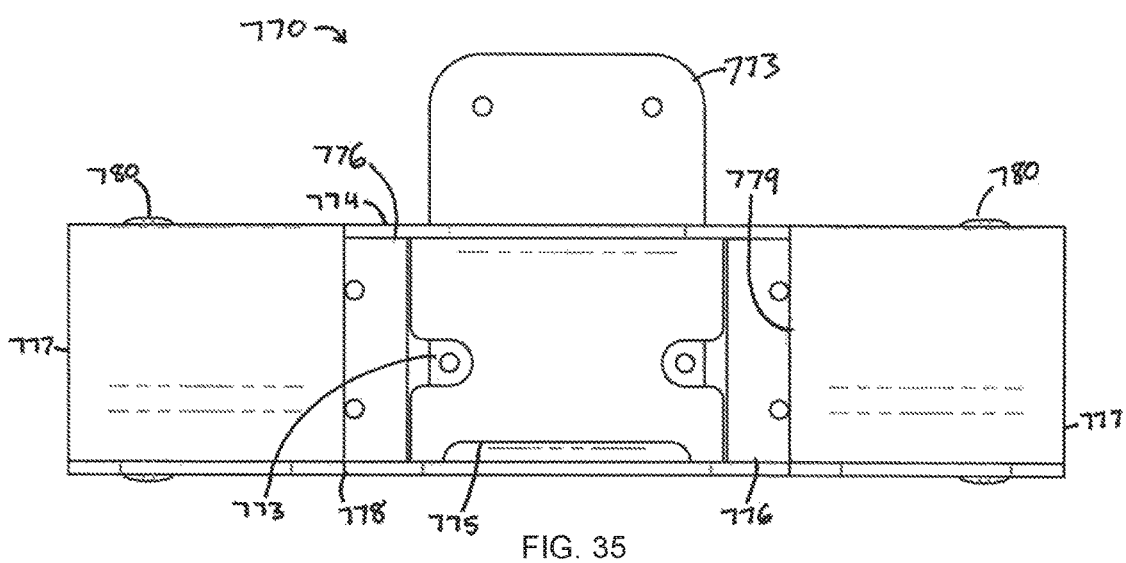
FIG. 35 is a front plan view of the mobile base unit of FIG. 33.
Figure 36:
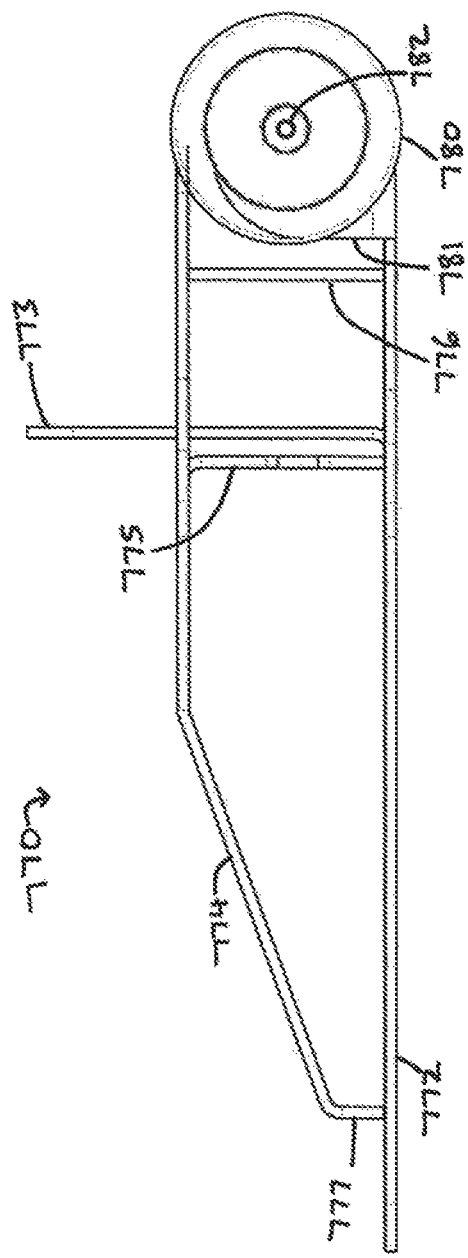
FIG. 36 is a side plan view of the mobile base unit of FIG. 33.

As shown in FIGS. 33, 35, and 36, an exemplary improved storage management system for electronic devices is also provided having a specialized coupling mechanism between the vertical channel support 570 and the base 515 to provide a secure connection and stability for the assembly. In various embodiments, this includes the use of fasteners produced by PEM® including PEM® nuts 512 and concealed head studs 513 for sheet metal as shown in FIG. 24. In addition, FIG. 24 reveals a plurality of resilient foot members 516 attached to the bottom of the base 515 to provide non-skid stability for the base on a support surface. It should be understood, however, that suitable alternative fastener methods and common fastener elements could be used instead and are contemplated within the scope of this disclosure. In addition, the embodiments shown in FIGS. 22-28 are shown as a metal assembly, however, it should be understood the assembly and components thereof may be crafted of various differing materials such as rigid extruded and/or vacuum-formed plastic, injection molded plastic, wood, or composites which are still within the scope of this disclosure.

FIGS. 29-31a illustrate improved features of the storage and charging station system of the invention. FIG. 47 shows a top wall 551 of the charging system that is connected to the top ends of a pair of sidewalls 552 extending upwardly through locking slots 543 in the bottom portions 531 and adjacent edge portions 532 and 533 of the shelves 530. The top wall 551 has a downwardly extending rear flange 553 bolted to the front member of the vertical tower support, and a pair of opposed downwardly extending side flanges each bolted to one of the opposed side walls and adjacent edge portions of the top shelf. The top wall 551 structurally secures the assembly of the connected elements, including hinged locking door 554, and further secures the storage bay provided within the confines of the top shelf 530 by preventing unauthorized removal of an electronic device from the shelf so long as the security door remains closed and locked. Additionally the top wall may have one or more access holes 556, as shown, to help facilitate connection of the top wall flanges to the supporting structures, and also aid in the dissipation of heat from electronic devices being charged within the shelf storage bays below.

Figure 30:
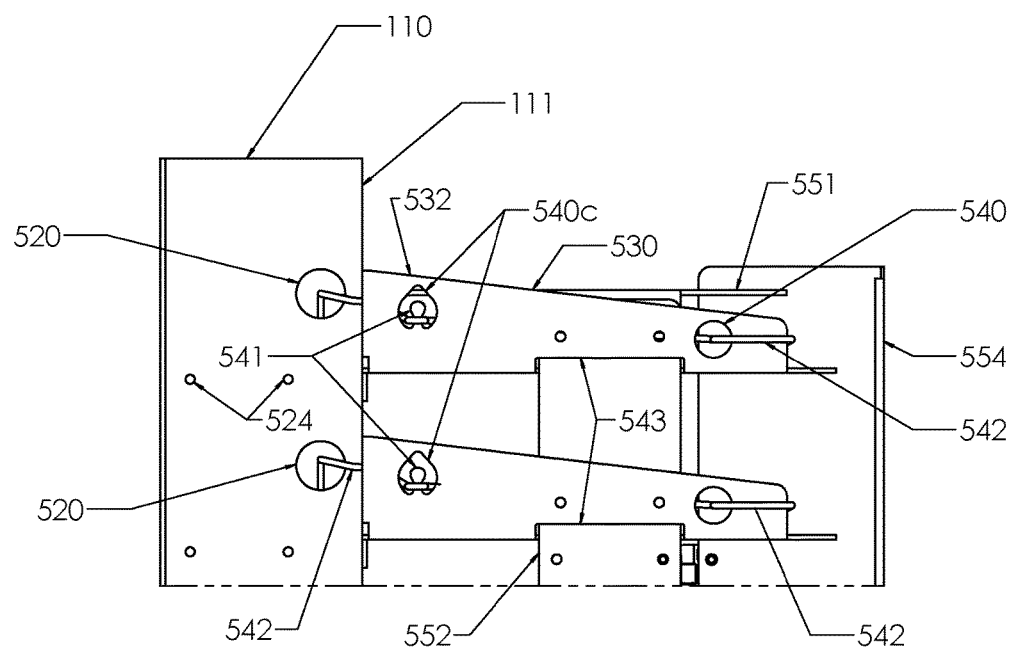
FIG. 30 is a partial side view of the tower and upper shelves of the assembly of FIG. 29.

FIG. 30 illustrates improved shelves wherein an additional shelf edge cable management aperture 540c is shown in the near edge portion of each of the illustrated shelves. The cable management aperture 540c is located near the rear end of the edge portion, and is characterized by a cable management tab 541 which can be unitarily formed from the shelf edge portion to extend upwardly within the cable management aperture 540c of the shelf edge portion 532. FIG. 31a illustrates an unnumbered shelf edge cable management aperture in the same near edge portion position as cable management aperture 540c of FIG. 30, wherein the cable management aperture edges and the cable management tab of the unnumbered cable management aperture terminate at the upper margin of the shelf raised edge portion. FIG. 48 further shows an electronic cable 542 retained within the cable management shelf aperture 540c by the cable management tab 541 to retain the cable adjacent the inside surface of the shelf near edge portion and adjacent side wall before extending outwardly from the storage bay through the shelf aperture 540 near the front end of the shelf edge portion 532 and around the front end of the shelf edge portion 532 to position the coupling end of the electronic cable within the margins of the shelf storage bay for easy electronic connection to an electronic device within the provided storage bay. The cable management tab 541 restricts lineal movement of the cable 542 through the cable management aperture 540c sufficiently to linearly retain the cable at that location and accordingly control the length of the cable 542 during plugging and unplugging the cable coupling end to and from the associated electronic device stored in that shelf 530. It can be seen from that the referenced unnumbered cable management aperture of FIG. 31a, with edges and cable management tab terminating at the upper margin of the shelf raised edge portion, will facilitate providing an electronic cable through the said unnumbered cable management aperture in the same position as cable 542 is shown in cable management aperture 540c of FIGS. 30 and 31.

Figure 31:
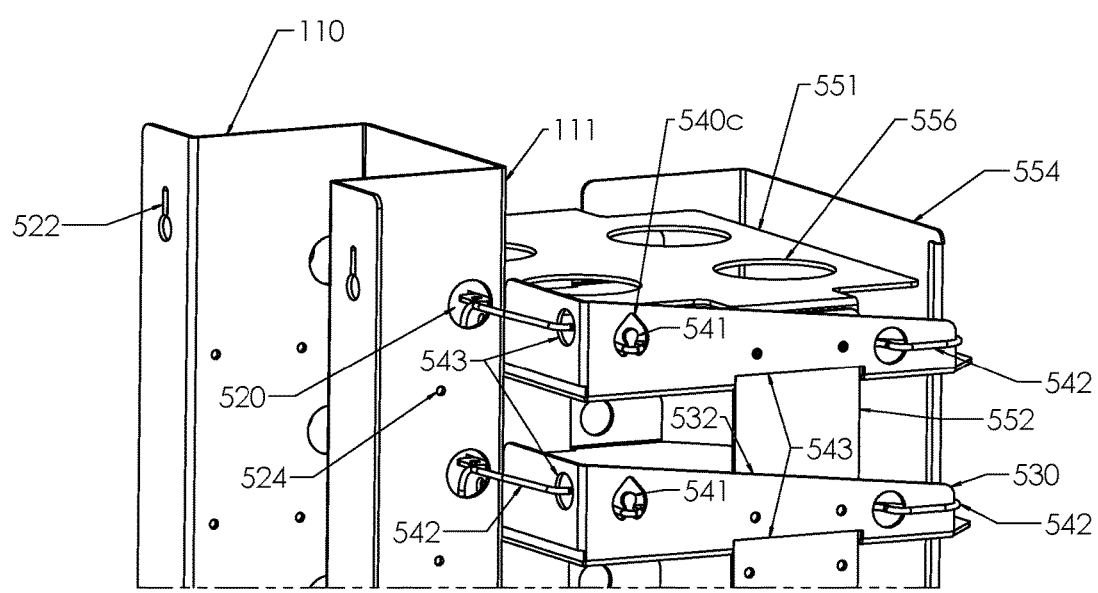
FIG. 31 is another partial side and rear view of the upper shelves of the assembly of FIG. 29.
Figure 31A:
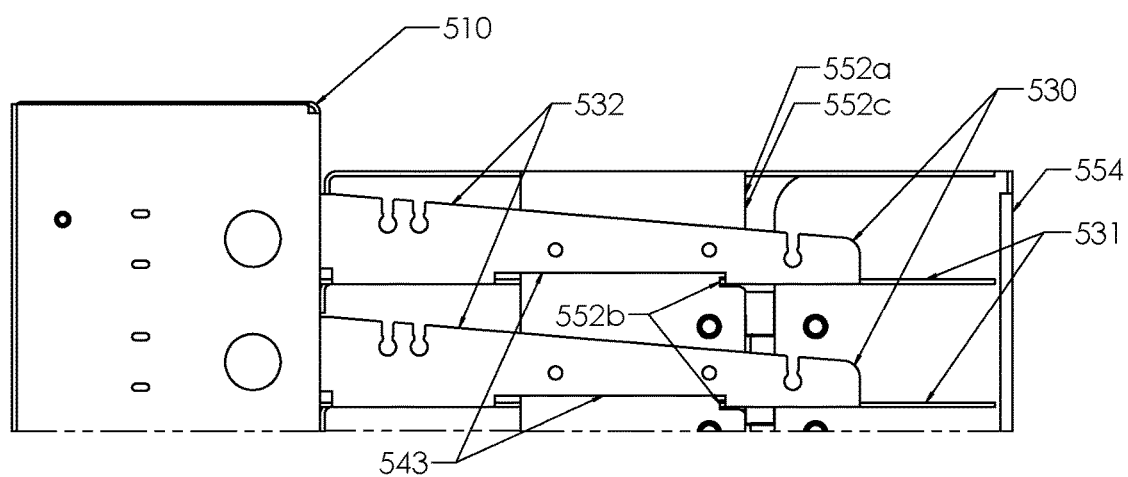
FIG. 31a is another partial side view of an exemplary improved embodiment of the invention.

FIG. 31 shows electronic cables 542 respectively emerging from cable apertures 520 in the side wall of the vertical tower support 110 and extending through back tab apertures 543 in the back tabs 533 of the shelf portions 530, which tabs are attached to the rear ends of adjacent shelf edge portions.

The back tab apertures 543 direct the electronic cables to the shelf edge cable management apertures 540c and associated cable management tabs 541, which in turn further retain the electronic cables in close proximity to the right angle corners of the shelves formed by the adjacent edge portions and back tab portions of the shelves. FIGS. 30 and 31 also show small cable tie holes 524 in the walls of channel 110 suitable for receiving cable ties to secure electronic cable in the channel 110 as desired.

In another exemplary embodiment of the assembly, FIG. 31a illustrates a modified sidewall 552a having horizontal engagement slots 552b in its outer edge 552c. As shown in FIG. 31a, the modified sidewall 552a extends down through locking slots 543 in the edge portions 532 and bottom portions 531 of shelves 530. The modified sidewall 552a has been moved forward to cause the engagement slots 552b to engage and provide vertical support for the bottom wall portion 531 of each of the shelves 530 of the array of shelves supported by a tower portion 510. Typically, but optionally, the top shelf 530 and the bottom shelf (not shown) of the shelf array will be bolted to the side wall 552a through available holes in the side wall and shelf edge portions 532. The intermediate shelves 530 will be adequately supported by the engaged sidewall locking slots 543. The modified sidewalls with engagement slots 552b can be sized to provide vertical support for any of the shelves with locking slots 543 coupled to any of the various tower supports disclosed herein.

The invention illustrated in FIGS. 32-43 and disclosed herein is generally directed to one or more embodiments of an improved mobile storage and charging station system for portable electronic devices. For ease of discussion and understanding, the following detailed description will at times refer to a "portable electronic device," an "electronic device," or a "plurality of electronic devices." While certain Figures in the incorporated referenced provisional and non-provisional references illustrate an electronic device as a laptop computer, it should be appreciated that an electronic device may be any suitable portable electronic device requiring storage and/or battery charging or recharging. For example, an electronic device may include, but is not limited to, a laptop computer, a netbook computer, a notebook computer, a Google Chromebook™ computer, a tablet device (such as an Apple iPad®, Samsung Galaxy®, or Microsoft Surface®, or any similar known or future developed tablet), a mobile smartphone, or any other known or future developed mobile or portable electronic device.

Figure 32:
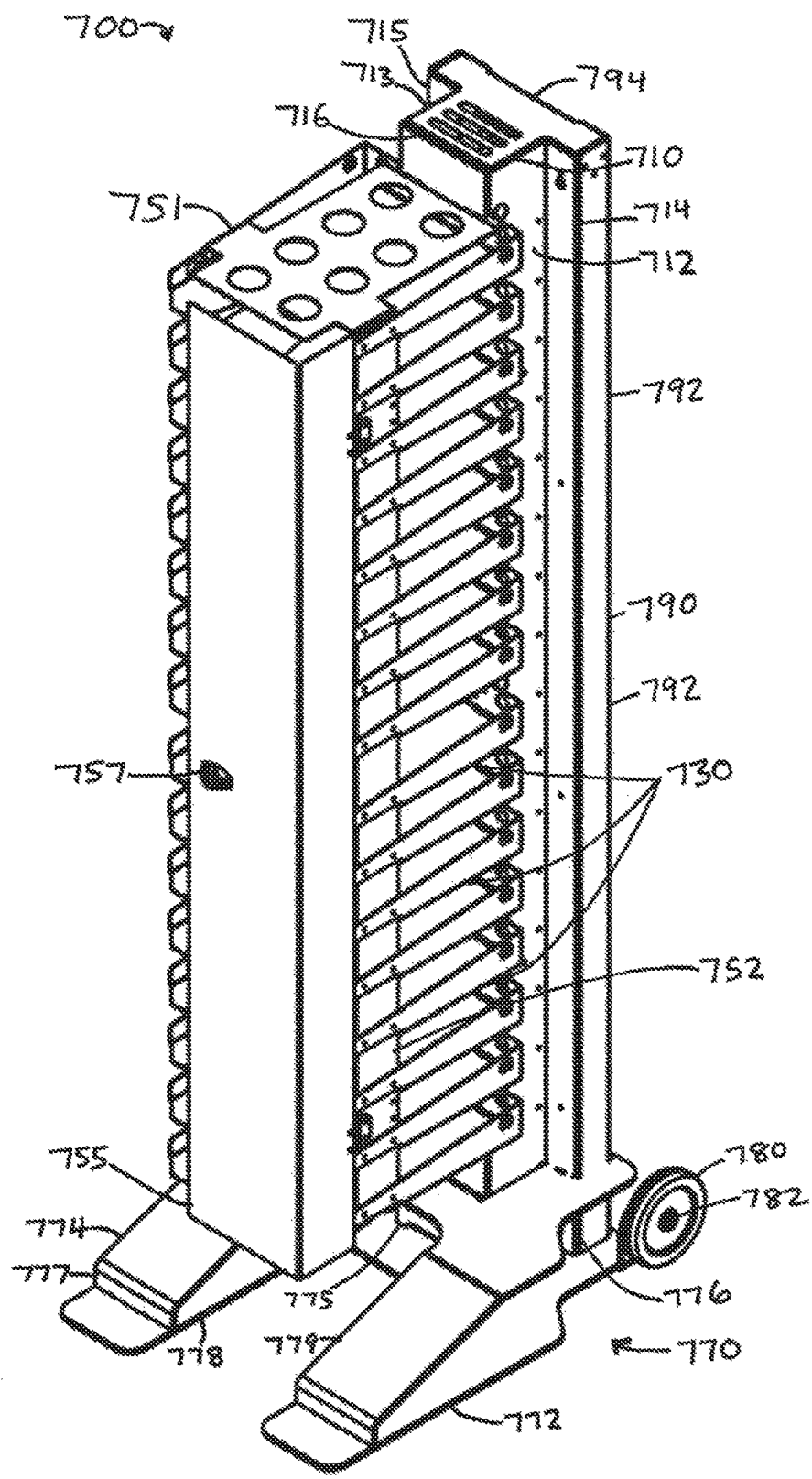
FIG. 32 is an isometric view of one or more examples of exemplary embodiments of an improved mobile storage and charging station of the present invention for housing, charging, transporting, providing and returning portable electronic devices.

Referring now to the Figures, FIGS. 32-37 illustrate one or more exemplary embodiments of an improved mobile storage and charging station assembly. FIG. 32 illustrates an improved mobile tower assembly 700, comprising a tower support 710 similar to tower support 110 of FIG. 1. Tower support 710 is coupled to an improved mobile base 770 in fixed relation to support the tower support 710 in a fixed vertical position when the lower plate 772 of the mobile base 770 is resting flat on a horizontal supporting surface such as a common building floor. A tower support frame 790 is likewise fixedly coupled to the rear sides of spaced tower support portions 714 and 715 and also fixedly coupled to spaced vertical connecting plate portions 776 of mobile base upper plate 774.

Figure 43:
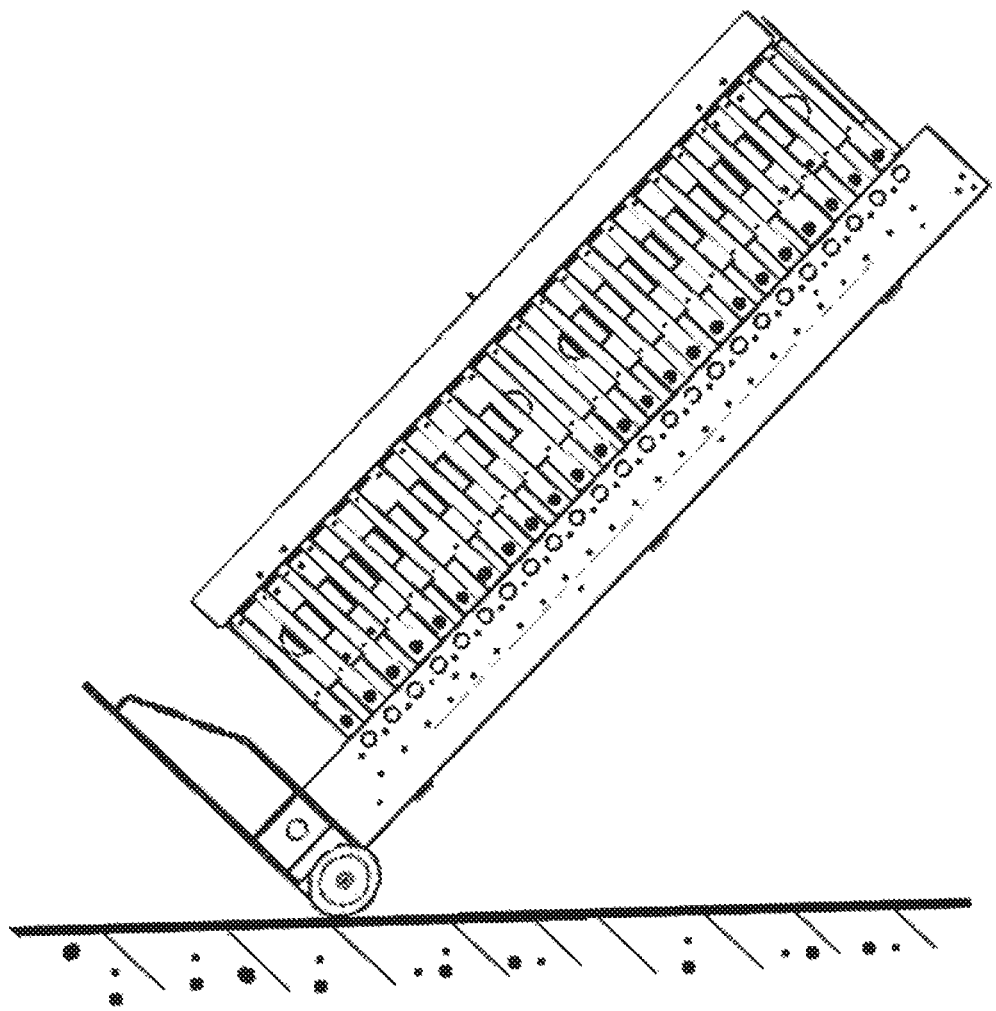
FIG. 43 is a side view of the improved mobile storage and charging station of FIG. 38 oriented in an inclined position as for movement like a loaded dolly to transport the station and its contents from one point of storage, charging or user access to another.

Referring to FIGS. 33-36, the lower and upper plates 772 and 774, respectively, of the exemplary mobile base 770, are advantageously formed of steel or other suitable metal, the front portions of which extend forwardly in substantially U-shaped fashion to provide a substantial footprint over a supporting surface, and a stable base and ballast for supporting the tower support and any structure supported by the tower. The U-shaped openings 778 and 779, respectively of the lower and upper plates of the base can be increased or decreased depending upon the relative weights of the base and tower and supported structure. Thus, increasing the design width and/or length of either or both of the U-shaped openings will increase the weight, ballast and forward balancing effect of the base, while reducing the design width and/or length of either or both of the openings will decrease the weight, ballast and balancing effect of the base, both with respect to stability of the tower assembly while stationary, and the balance and weight distribution of the mobile charging station tower assembly when the unit is pivoted rearwardly onto the rearwardly projecting wheels 780, as shown in FIG. 43, for balanced transport of the assembly in dolly-like fashion between points of storage, charging or use. The two rearward wheels 780 are supported by axle bolts 782 engaged in wheel hangar supports 781 formed by upwardly and rearwardly extending portions of the base lower plate 772. The wheels extend substantially to the same level as the base lower plate, which may include a pad (not shown) which covers the bottom surface of the lower plate 772 to substantially prevent the lower plate from marring a supporting surface.

The exemplary base upper plate 774 has forward portions which define each side of the upper plate U-shaped opening and are inclined downwardly from the level of the rear portion of the upper plate and terminate with short vertical legs 777 which are welded to the lower plate 772. The upper plate 774 additionally has a central downwardly extending support flange 775 which terminates on and is welded to the lower plate 772. The lower plate 772 additionally has an central upwardly extending tower support flange 773 which is closely spaced parallel to and rearwardly of the welded support flange 775 whereby the central member 711 of the exemplary aluminum tower support 710 may be secured closely between the steel support flanges 773 and 775 by bolts, machine screws and PEM® nuts, or any other suitable known or future-developed fasteners. Additionally, the base upper plate 774 has opposed cut-out openings 783 rearwardly of the downwardly extending support flange 775 and to either side of the upper plate opening from which the support flange 775 was cut and downwardly bent, which are positioned to closely receive the tower support portions 714 and 715, and the vertical frame members 792 of the tower support frame 790. Additionally, vertical connecting plate portions 776 are welded between the lower and upper base plates 772 and 774 immediately forward of the front edges of the cut-out openings 783. The exemplary vertical steel or aluminum frame members 792 and the tower support portions 714 and 715 are likewise secured to the connecting plate portions by bolts, screws and PEM® nuts, or any other suitable known or future developed fasteners. In addition, the tower support frame 790 includes a top frame portion 794 which extends between and connects the two vertical frame members 792 to provide a handle for supporting, pushing and controlling movement of the improved mobile tower assembly during transport of the tower assembly from venue to connected venue for storage, charging and convenient user access.

Accordingly, the tower support 710 is securely coupled to the connected support structure of the mobile base unit 770 and the vertical frame members 792 to provide an improved mobile tower assembly 700. Such mobile tower assembly 700, as shown in FIGS. 32 and 33, will securely support the plurality of shelf portions 730 and top wall 751 which are attachable to the central member 711 of the tower support 710, the first side wall 752 and second side wall 753 which are attachable to the plurality of shelf portions 730, the hinge members 755, doors 754, locking members (not shown) and locking handle or keyed lock 757 which are attachable to the side walls, and most importantly, the plurality of portable electronic devices (not shown) which will be individually placed in selected shelf portions 730 for charging, storage, withdrawal for use and return of the portable electronic members, during both stationary and mobile dolly-like use of the improved mobile tower assembly 700.

Figure 37:
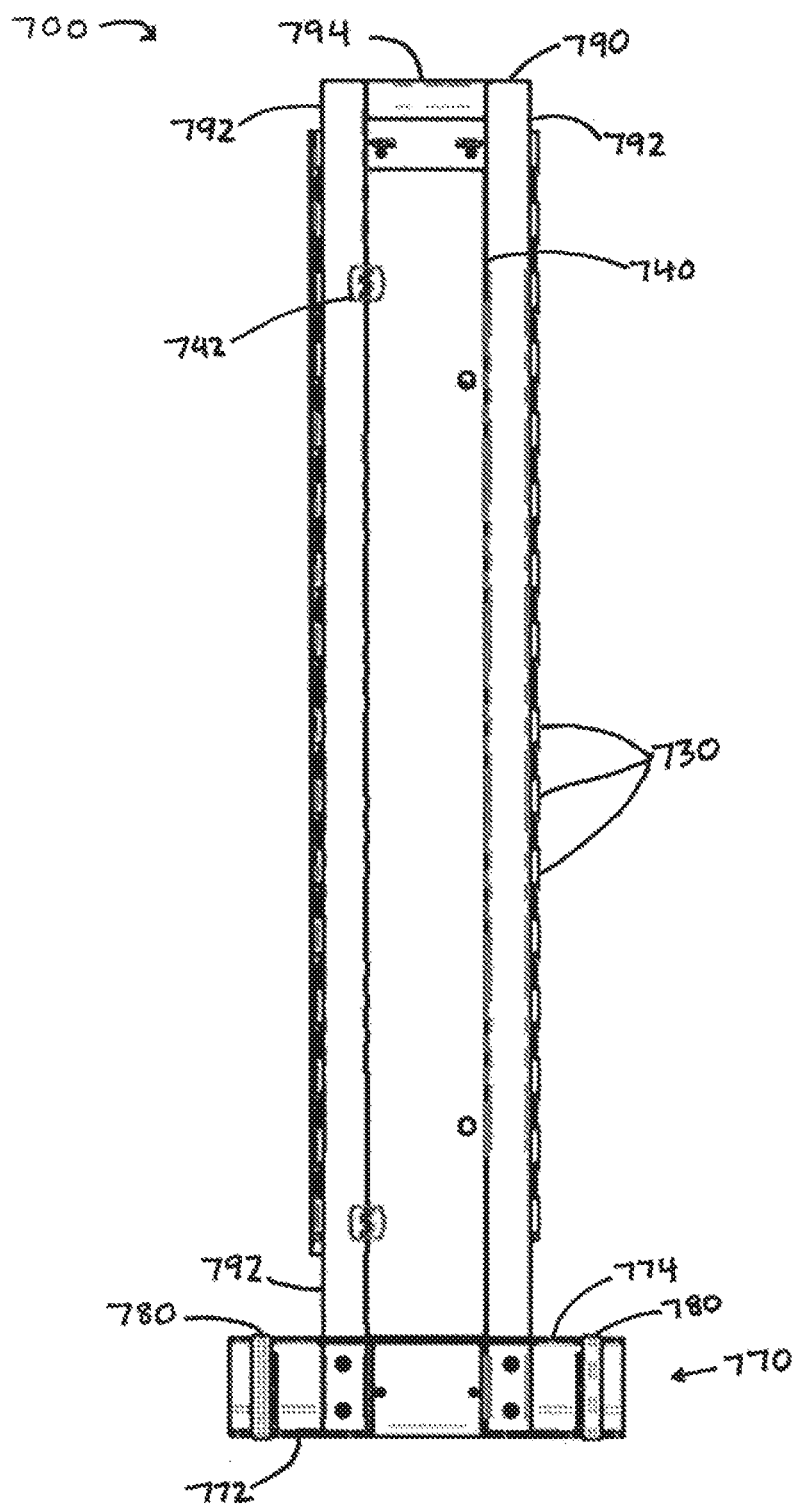
FIG. 37 is a rear plan view of the improved mobile storage and charging station of FIG. 32.

Referring now to FIG. 32, it is seen that the tower support 710 includes a first member 711, and second member 712 and third member 713 which are connected to the first member 711 to define a three-sided cable management channel 116. In addition, the tower support portions 114 and 115 are outwardly connected to the second member 712 and the third member 713, respectively. In different exemplary embodiments the various members and support portions may be perpendicularly connected as shown, or may be connected at acute or obtuse angles as the design may allow or require for function, appearance or ease of forming. The various members and portions of tower support may be formed of a unitary pressed, bent or molded material, although it should be appreciated that in one or more exemplary embodiments, the various members may be separately formed and coupled together. In the exemplary embodiment shown, the tower support 710 is advantageously and unitarily fabricated from bent aluminum sheet. Cable management channel 716 is utilized for the placement of one or more power strips and cable connectors (not shown) for providing power for charging each of the personal electronic devices individually positioned on each shelf portion as more extensively described in referenced U.S. Provisional Application 62/135,549. FIG. 37 shows a door 740 attached to a tower support vertical side member 792 by hinges 742 with one or more locks and/or handles 744 for securing and opening the door 740 to secure and access the power strip and cable connectors within the cable management channel 716. FIG. 37 also shows fasteners for coupling the vertical frame members 792 to the tower support 710 and the vertical connecting plate portions 776.

Because of the ease of identifying each portable electronic device with each user and each assigned storage shelf, and the speed and ease of user withdrawal for use and replacement for storage and charging of the portable electronic devices at multiple user sites, and the ability of teachers, supervisors, administrative staff and equipment managers to determine at a glance whether all personal electronic devices are out, or returned, the improved mobile storage and charging station of the invention saves enormous amounts of administrative time for the organization providing or managing the portable electronic devices.

Referring now more specifically to the exemplary embodiments of the present invention comprising an improved mobile multiple shelf tower assembly 800 for portable electronic devices illustrated in FIGS. 38-43, it is seen that the embodiments of FIGS. 38-43 differ in several respects from the previously described embodiments of FIGS. 32-37. FIGS. 38-43 illustrate an integral aluminum tower support 810 comprising a pair of side channels 814 and 815 extending outwardly, rearwardly and inwardly from the second and third members 812 and 813. Accordingly, in addition to the central cable management channel 816, tower support 810 provides two power strip channels 814 and 815, each of which houses a 12 outlet power strip 820 in the manner shown in FIG. 39, which is a section view taken along Section Line A-A on FIG. 40. Thus the tower support 810 is capable of providing power to portable electronic devices in 24 shelf portions 830, with side channel space and cable management channel space to accommodate the additional power strip and cable requirements for powering 24 portable electronic devices (not shown).

Figure 38:
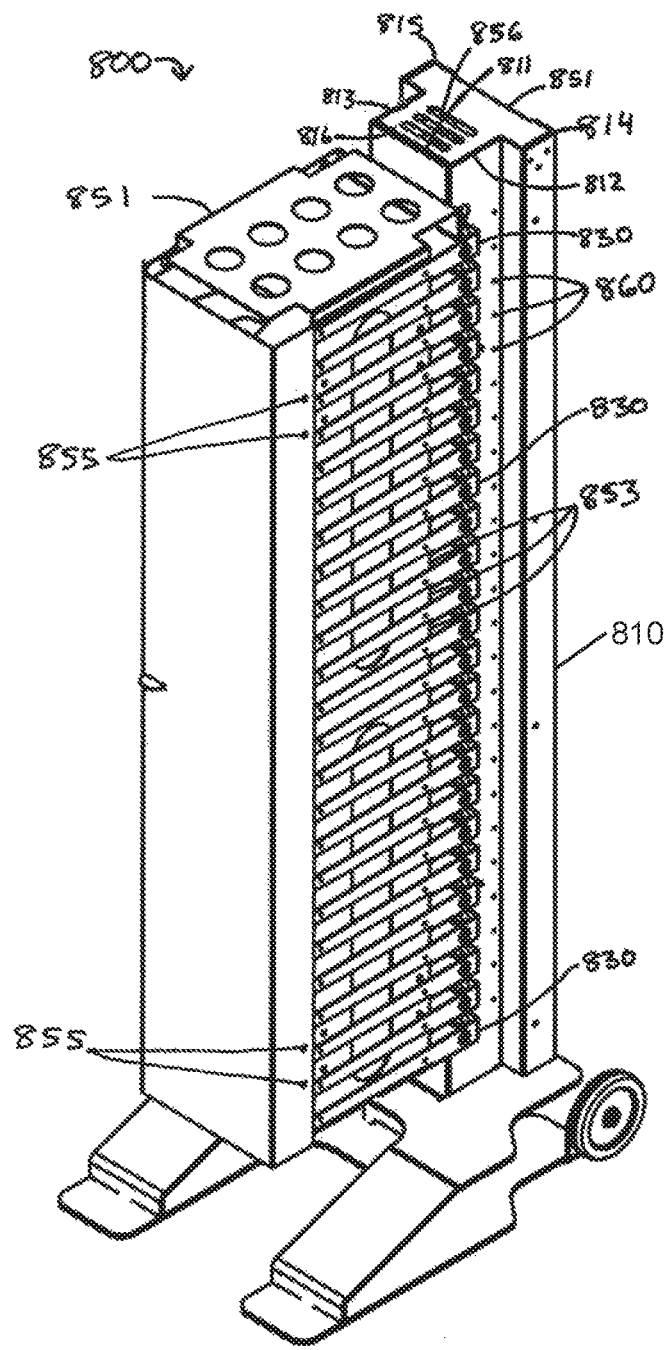
FIG. 38 is an isometric view of a another exemplary embodiment of the improved mobile storage and charging station of the invention for housing, charging, transporting, providing and returning portable electronic devices.
Figure 39:
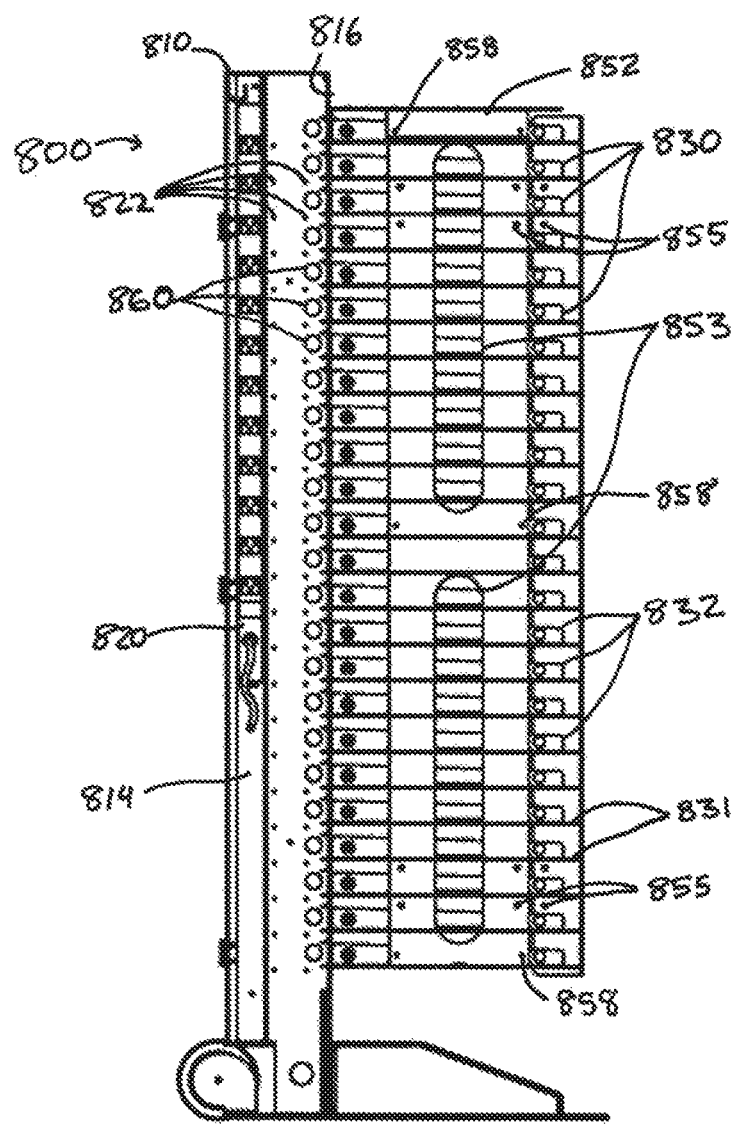
FIG. 39 is a section view of the improved mobile storage and charging station of FIG. 38, taken along Section Line A-A of FIG. 40.

Additionally, tower support 810 optimally provides for attachment of up to 24 shelf portions 830 without significantly increasing the access height of the top shelf 830. The typical decrease in size of current personal electronic devices permits the use of shallower shelf portions 830 which may be more closely spaced to provide a single tower support for up to 24 shelves without exceeding a reasonable shelf height for users. However, increasing shelf density and numbers on a single tower support creates significant challenges with respect to power strip and cable connector management. These issues are solved by the improved tower support 810 with its added side channels for power strip placement and deeper central cable management channel 16 area. In addition, as shown in FIGS. 38 and 39, at least one and optimally two small cable tie holes 822 are provided in second channel member 812 and third channel member 813 adjacent each side of each vertically spaced shelf location on the tower support 810 to permit the optional use of common plastic cable ties (not shown) extending inside and outside the tower support 810 through selected and conveniently available cable tie holes 822 to retain cables running vertically and otherwise within the cable management channel 816 in close managed proximity to channel members 812 and 813. This provides for easier cable identification and service access to cables and cable access slots or holes 860 in the channel members 811,812 and 813 and rear and side panels of shelf portions 830, in the manner shown in FIGS. 30 and 31 for the purpose of convenient user cable connection to and powering of the portable electronic devices for recharging each time a portable electronic device is reloaded into the shelf portions after every use. Such convenience is essential to minimizing reloading and connecting time when students or employees are required to re-shelve and charge all electronic devices at the end of a class hour or school or work day. Lack of convenience at that hectic time for the user can result in more class or work time loss to increase scheduled time for waiting to access replacement of 16 or 24 electronic devices in a single mobile tower assembly. In addition, if replacement and reconnection of devices at end of class hour or work period is inconvenient or difficult, many devices may be left unconnected and not recharged by frustrated users, requiring more monitoring by teachers or administrative managers.

The tower assembly shown in FIGS. 38-43 includes additional and improved security which is effective for the smallest of portable electronic devices. FIGS. 38 and 39 illustrate an improved sidewall 852 which extends for the entire length of the array of installed shelves 830 to substantially prevent any effective access to the shelf contents from either side of the array. The sidewalls 852 extend down both sides of the array of shelves 830, and within the margins of the shelf edge portions 832 through adjacent slots (not shown) in the shelf bottom portions 131. The exemplary sidewalls 852 are provided with at least one vertical open window 853 (two windows 853 are illustrated in FIGS. 38 and 39), window openings are defined by the surrounding margins of the sidewalls 852. The side walls 852 can be fastened to selected upper, mid-level and lower shelf edge portions 832 by machine screws and PEM® nut fasteners 858 or any other suitable known or to be discovered fasteners and are additionally retained in close proximity to the shelf edge portions 832 by slots in the shelf bottom portions 131 through which they extend. Effective side access to the interior of the shelves 830 and their contents is effectively prevented by the limited spaces between shelf edge portions 832 not covered by the sidewalls 852. Nevertheless, important visual access to the content of the shelves is importantly provided by the spaces between shelf edge portions 832 and the windows 853 to allow teachers or administrative personnel to quickly view the interiors of the shelves at any time to determine whether the electronic device assigned to any shelf is either present or absent, depending upon the time of day and the use, charging and storage/inventory requirements of the owner. As further best shown in FIG. 38, access to the contents of the upper shelf 830 of the shelf array is prevented by top wall 851 secured to the tower support in the same manner as more fully disclosed and referenced and incorporated above with reference to FIGS. 29-31. The top wall 851 is also beneficially attached to the top shelf 830 by suitable fasteners (not shown).

Access to the contents of the shelves is exemplarily controlled by door 854 and locking handle 857. The door is pivotally attached by hinges not shown and fasteners 855, which may be attached to sidewall 852, as shown, or other provided structure.

Figure 40:
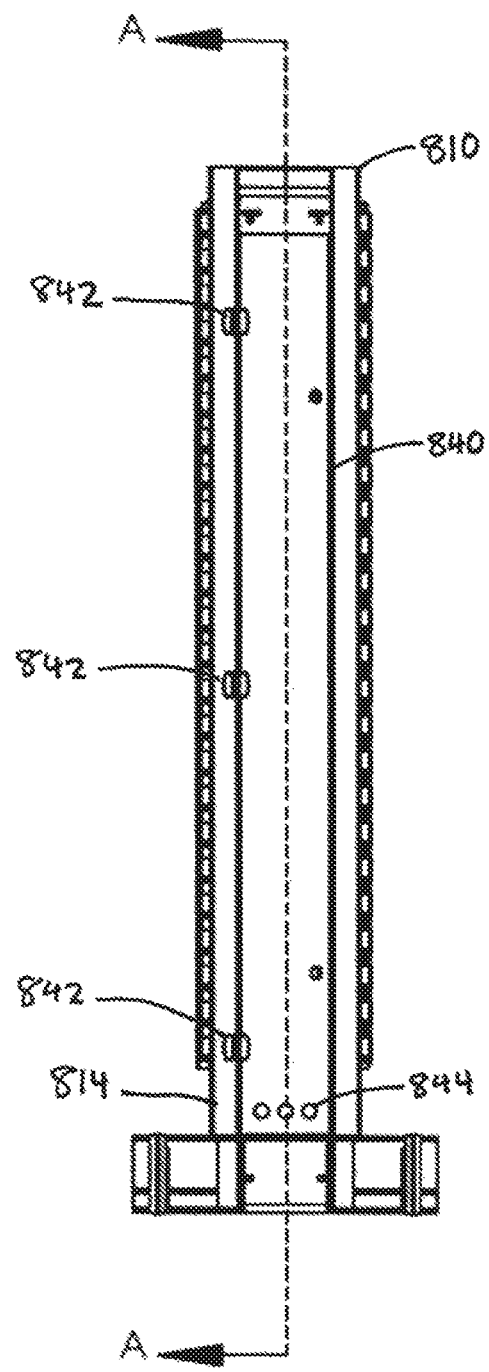
FIG. 40 is a rear plan view of the improved mobile storage and charging station of FIG. 38.
Figure 41:
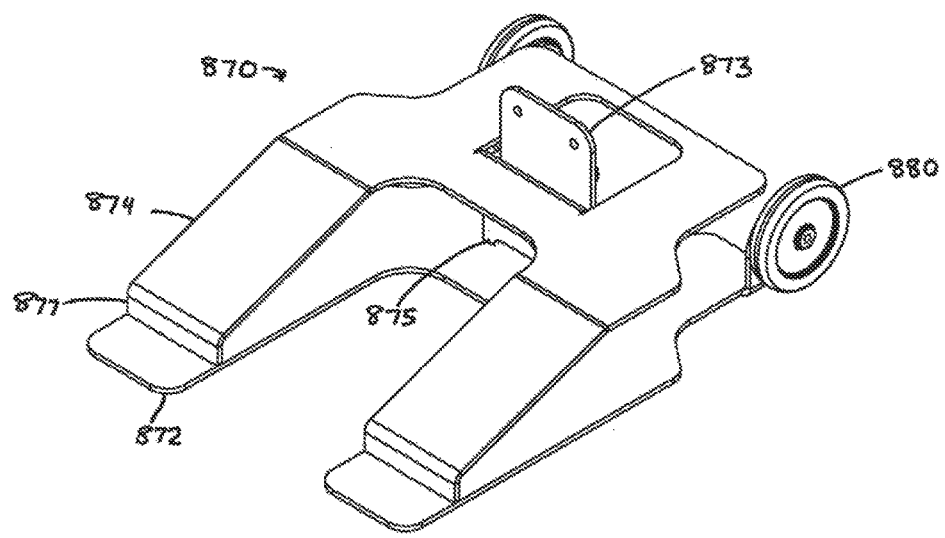
FIG. 41 is an isometric view of the mobile base unit for the improved mobile storage and charging station of FIG. 38.
Figure 42:
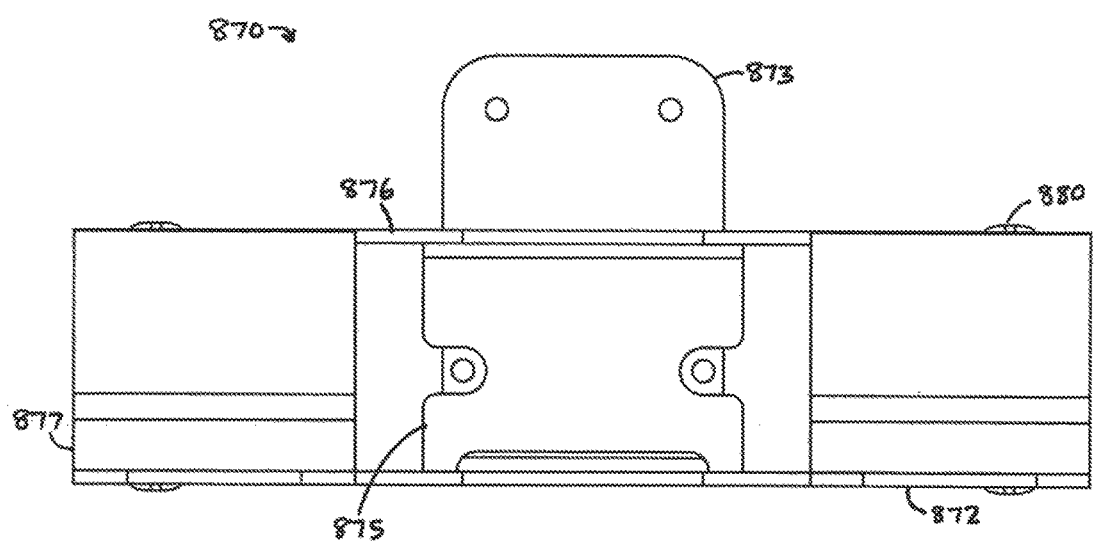
FIG. 42 is a front plan view of the mobile base unit of FIG. 41.

Access to the power strips 820 and cable connectors (not shown) is provided by rear door 840, as shown in FIG. 40. Door 840 is pivotally attached by hinges 842 to the back side of power strip channel 814 of the tower support 810, with one or more locks and/or handles 844 for securing and opening the door to secure and access the power strips 820, cable connectors (not shown) and cable access slots or holes 860 in the tower support to reach the shelves within which the portable electronic devices must be connected.

The tower support 810 has an attached top wall 851 defining ventilation openings 856, as shown in FIG. 38. Likewise, rear door 840 has ventilation openings 844 shown in FIG. 40. The ventilation openings 844 and 856 allow cooling air to enter the lower ventilator openings 844 and flow upwardly through the tower support 810 whereby air within the tower support which is heated by the operation and electrical conduction by the power strips 820 and cable connectors (not shown) will pass out of the tower channel through the top wall ventilation openings 856.

The exemplary mobile base 870 which is illustrated is FIGS. 38-43 for use with the improved mobile storage and charging station assembly 800 is essentially the same as the mobile base 770 illustrated in FIGS. 32-37, except for changes made possible by the one-piece design of the improved tower support 810. The increased stiffness of the tower support 810 provided by side channels 814 and 815 enabled the elimination of both the structure and the weight of the tower support frame 710 of the embodiment of FIGS. 32-37. Thus it is not necessary to provide the spaced vertical connecting plate portions 776, which function to connect the vertical frame members 792 to the base 770, nor is it desirable to provide the two upper plate cut-out openings 783 in the mobile base 870. It will be seen from FIG. 38 that the side channel 814 of the tower support 810 does not extend below the top surface of the upper plate 874 of the mobile base 870. The tower support middle channel member 811 is connected to the lower plate central support flange 873 and the upper plate central support flange 875 in the same manner as previously described with respect to tower support middle member 711 and support flanges 773 and 775 and as shown in FIGS. 32-38. In all other respects, the mobile base 870 is substantially the same as mobile base 770.

The improved mobile storage and charging station assemblies 700 and 800 both include a combination of components which combine to efficiently and securely store, charge and conveniently move to convenient user venues multiple portable electronic devices for classroom and conference room use and user training, and further permit fast and easy user dispensing, and return of charging connection of assigned electronic devices by the users, with little supervision by teachers or administrative personnel. The novel mobile base designs illustrated and described herein have an open design which permits interior access for fabrication and rigid connection of tower supports, but also permits design adjustments to provide more or less weight depending upon the number of shelves attachable to the tower support and the type of portable electronic devices targeted for storage and charging. The base and attached tower support provide stability when the assembly is stationary, and balance and ease of transport of contents in well-balanced dolly-like manner when it is desired to move the mobile storage and charging station assembly between storage, charging and convenient use venues within a facility. While exemplary embodiments of the present invention have been illustrated and described, it should be clear that various design changes, substitution and selection of available and advantageous materials, and aesthetic or use oriented changes can be made to the structure and arrangement or inclusion of features described herein or in U.S. Provisional Application 62/135, 549, the subject matter of which is incorporated herein by reference, without departing from the objects of the invention.

Assemblies 100, 200, 300, 400, 500, 600 and other improved embodiments shown also include certain advantages that may not be readily ascertainable from the disclosure provided herein. The assembly provides a simple, clean, easy to use space saving design for the effective management of portable electronic devices. The sloped sides of the edge portions of each shelf portion provides an open design which provides easy viewing of electronic devices stored therein. The easy viewing allows for ease of inventory and management of electronic devices. The cable management system provided with the associated channel avoids an undesired mess of inter-tangled cables, while also protecting cables from damage or loss since the cables generally do not need to be removed. The vertical stacking of the plurality of shelf portions provides for a low profile and small footprint, providing space savings. For example, in a school setting, by incorporating the vertical stacking arrangement, the assembly has a footprint similar to a school locker while able to store and manage a full classroom of electronic devices. The locking assembly provides a door having no pinch points, which can avoid damage to cables or users. In addition, by providing a central battery charging and/or recharging location for all portable electronic devices stored in assembly, the risk of loss of battery charging devices is greatly reduced. Since the battery charger, AC adapter(s), or other charging device remains with the assembly when the portable electronic devices are removed, there is a reduced chance of theft or loss of the battery charging device.

In addition, updating or performing a central data transfer to portable electronic devices stored in assembly is made easier. For example, a party performing the update may plug in or hook up a data cable, such as a CAT5 or CAT6 cable, to each device in assembly. As an alternative, each device may be connected to a central data hub while being stored in the assembly, allowing for a distribution of updates through the central data hub. Such a connection may be wired or wireless. In either case, the party performing the update may quickly and easily update portable electronic devices stored in the assembly, as portable electronic devices are centrally located and accessible while being stored. The assembly also allows for users to manage pick up and drop off of portable electronic devices. This is especially advantageous for applications in primary schools, where users may be children, and more specifically young children. In this application, portable electronic devices can be easily picked up and dropped off by children without substantial supervision by an adult or teacher. For such classroom use, the assembly illustrated and described herein facilitate complete management of the removal/unplugging and return/plugging in of electronic devices by the student with only the unlocking and locking of the door requiring action by the teacher. In a typical school year cycle, the assembly can save in excess of 60 hours of classroom time for the teacher, which may otherwise be used for classroom instruction, as compared to a classroom where the electronic devices are accessed from and returned for charging to a typical cart by the teacher.

The assemblies disclosed in FIGS. 22-49 also include certain advantages that may not be readily ascertainable from the disclosure provided herein. The improved shelf mechanisms shown therein allow for adult and child users to reach into the assembly, grip both top and bottom surfaces of and retrieve an electronic device easily from any angle. Because a user may be standing, crouching, leaning, or in any other position while removing the device, it is important the user should have a firm grip on the device to prevent damage and injury. Likewise, the user can maintain a firm grip on the device while correctly positioning the device on a shelf for storage and charging.

The improved cable management system allows for protection of the power distribution strips. Removable access panels cover the power distribution elements, while the cable management system provides connectability by the user for charging, while limiting possible interaction with electricity by the user and preventing shock or injury. It also limits movement of the power strip and charging components, which can prevent the device charging components from damage caused by repeated removal.

The metal structure, specialized fasteners, and floor/supplemental mounting features all provide for a secure storage system. This is especially important as the number of devices grows and the tower is taller. The system may be deployed in classrooms, where users may bump into the tower without likely damage to its components or the stored electronic devices. These improved features allow the system to support a large number of devices without compromising safety and stability.

Although various representative embodiments of this invention have been described above with a certain degree of particularity, those skilled in the art could make numerous alterations to the disclosed embodiments without departing from the spirit or scope of the inventive subject matter set forth in the specification and claims. Joinder references (e.g., attached, coupled, connected) are to be construed broadly and may include intermediate members between a connection of elements and relative movement between elements. As such, joinder references do not necessarily infer that two elements are directly connected and in fixed relation to each other. In some instances, in methodologies directly or indirectly set forth herein, various steps and operations are described in one possible order of operation, but those skilled in the art will recognize that steps and operations may be rearranged, replaced, or eliminated without necessarily departing from the spirit and scope of the present invention.

It is intended that all matter contained in the above description or shown in the accompanying drawings shall be interpreted as illustrative only and not limiting. Changes in detail or structure may be made without departing from the spirit of the invention as defined in the appended claims.

Although various representative examples of embodiments of this invention have been described above with a certain degree of particularity, those skilled in the art could make numerous alterations to the disclosed embodiments without departing from the spirit or scope of the inventive subject matter set forth in the specification and claims. In some instances, in methodologies directly or indirectly set forth herein, various steps and operations are described in one possible order of operation, but those skilled in the art will recognize that steps and operations may be rearranged, replaced, or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

Although the present invention has been described with reference to particular embodiments, persons skilled in the art will recognize that changes may be made in form and detail without departing from the spirit and scope of the invention.

What is claimed is:

1. An expandable storage assembly for storing a plurality of portable electronic devices comprising:
   a tower support portion having a first member coupled to a second member, and a third member coupled to the first member, the second and third members being provided at an angle to the first member such that the first, second, and third members define a vertical channel provided on a first side of the tower support portion;
   a base member coupled to the tower support portion and adapted to support the tower support portion in a vertically extending position on an elevated horizontal working surface to provide convenient access for a portable electronic device user group; and
   a plurality of shelves removably attachable to a second side of the tower support portion, wherein the second side is opposite the first side, each said shelf defining a storage bay including a generally planar bottom portion having a front margin and a back margin and opposing first and second raised edge portions each extending upwardly along opposed sides of the bottom portion for supporting and retaining a portable electronic device on the shelf for storage and charging, with bottom portion retaining tabs extending from said back margin being receivable by tower support portion first member first shelf receiving slots, and raised edge portion retaining hooks being receivable by tower support portion first member second shelf receiving slots, and said retaining hooks being engageable with the first member of the tower support portion to retain the shelf on said second side of the tower support portion, the first and second raised edge portions having a generally lower height along a front portion of the bottom portion of the shelf than along a back portion thereof near the tower support portion to provide enhanced user visibility of one or more devices received by a plurality of said shelves retained on the tower support portion, wherein the plurality of shelves are coupleable in a stacked, spaced vertical arrangement along the first member of the tower support portion, and the tower support portion and the shelves further defining a plurality of first cable support apertures for support of and entry and exit of electronic cables to and from the vertical channel and the shelves and between the vertical channel and each shelf, the cable support apertures each providing managed electronic cable access for at least one electronic device supported by each shelf at spaced locations along the tower support portion.

2. The storage and management tower assembly of claim 1, wherein the vertical channel includes a fourth member coupled to at least a one of the second member and to the third member in spaced relation to the first member.

3. The storage and management tower assembly of claim 2, wherein a power distribution strip is couplable to an interior of the vertical channel, the power distribution strip including a plurality of electrical outlets.

4. The expandable storage assembly of claim 1, further comprising:
a pair of opposing first and second back tabs provided on each of the shelves, the first back tab being coupled to said first raised edge portion, the second back tab being coupled to said second raised edge portion, the first and second back tabs being provided at an angle to the respective first and second raised edge portions, wherein the first and second back tabs each include an engagement portion of a said retaining hook which is respectively receivable by one of said tower support portion first member second shelf receiving slots to couple each of the plurality of shelves to the tower support portion.

5. The expandable storage assembly of claim 4, wherein the first and second raised edge portions each have a bias to facilitate coupling of each retaining hook of the back tabs with the respective one of said tower support portion first member second shelf receiving slots.

6. The expandable storage assembly of claim 1, wherein the bottom portion of at least one of the shelves has a front edge which defines a substantially U-shaped open area extending rearwardly into the shelf bottom portion to enable a user of one of said portable electronic devices to easily and simultaneously grasp both an upper and lower surfaces of the portable electronic device within margins of the U-shaped open area to facilitate placement onto and removal from said at least one shelf.

7. The expandable storage assembly of claim 6, wherein the width of the U-shaped open area defined by the front edge of the bottom portion of the shelf decreases as the U-shaped open area in the bottom portion of the shelf extends rearwardly from the said front margin of the shelf.

8. The expandable storage assembly of claim 6, wherein the maximum width of the U-shaped open area defined by the front edge of the bottom portion of the shelf is not more than approximately one-half the width of the shelf bottom portion.

9. The expandable storage assembly of claim 1 wherein said tower support portion comprising said first member, second member and third member further comprises at least a fourth member, and wherein said at least four members are connected to define the vertical channel, and wherein at least a portion of said at least four members can be removeably coupled to said vertical channel to define an access panel to selectively provide access to an interior of the vertical channel when the access panel is at least partially disengaged from the vertical channel and to prevent access to the interior of the vertical channel when the access panel is fully coupled to the vertical channel.

10. The expandable storage assembly of claim 9 wherein said base member coupled to the vertical channel of said tower support portion extends laterally to underlie both the vertical channel and at least a portion of any shelves coupled to the second side of the tower support portion whereby said tower support portion is supported in a vertical position by said base member and the plurality of shelves are supported in generally horizontal positions in cantilever fashion by the tower support portion.

11. The expandable storage assembly of claim 9 wherein a top portion is couplable to an upper end of the vertical channel to close the upper end of the vertical channel and limit access to the interior of the vertical channel, and wherein the top portion defines at least one ventilation opening to permit air to escape from the interior of the vertical channel for ventilation purposes.

12. The expandable storage assembly of claim 9, wherein at least one member of the vertical channel has at least one ventilation opening adjacent the bottom of the vertical channel to permit ambient air to flow into the interior of the vertical channel for ventilation purposes.

13. The expandable storage assembly of claim 9, further comprising a locking assembly having a first sidewall positionable adjacent to at least said first raised edge portions of the plurality of shelves, a second sidewall positionable adjacent to said second raised edge portions of each of the plurality of shelves, the first and second sidewalls each being coupleable with a plurality of said shelves, a top wall coupleable to the first and second sidewalls for overlapping a portion of a topmost shelf of the plurality of shelves when in the stacked, spaced vertical arrangement, and at least one door pivotably connectable to one of the first sidewall or second sidewall for selectively limiting visual and physical access to at least a portion of interiors of each of the shelves, the door being selectively engageable with a locking member provided on one of the shelves of the plurality of shelves.

14. The expandable storage assembly of claim 13, wherein each of the plurality of shelves includes a first locking slot provided between said first raised edge portion and the bottom portion, and a second locking slot provided between said second raised edge portion and bottom portion, and wherein the first sidewall is engageable within the first locking slots of the plurality of shelves, and the second sidewall is engageable within the second locking slots of the plurality of shelves, and wherein the shelves are each securable to an adjacent sidewall.

15. The expandable storage assembly of claim 14 wherein each of the first sidewall and the second sidewall have a plurality of spaced engagement slots, each of which engagement slots enable engagement therein of the bottom portion of one of said shelves adjacent to a forward end of an adjacent one of said shelf locking slots to provide stability and vertical support for the engaged shelf adjacent said forward end.

16. The expandable storage assembly of claim 1, wherein at least one of said first cable support apertures defined by one of said shelves is a cable management aperture located in one of said first and second shelf raised edge portions, and wherein the cable management aperture includes a cable management tab which extends between opposed edges of the said cable management aperture in closely spaced relation thereto whereby an electronic cable can be positioned and retained against one of said opposed aperture edges, then against and around the cable management tab and then against the other of said opposed aperture edges to restrict lineal movement of the electronic cable through said cable management aperture and provide a relatively constant cable length to the forward end of the shelf for electrical engagement and disengagement to and from electronic devices stored on the shelf.

17. The expandable storage assembly of claim 16 wherein the one of said first and second shelf raised edge portions in which the said cable management aperture is located has an upper margin, and wherein the said cable management aperture edges and the cable management tab terminate at the said upper margin of the one of said first and second shelf raised edge portions to permit an electronic cable to be easily threaded through the cable management aperture and around the cable management tab.

18. A countertop storage and management assembly for a plurality of portable electronic devices comprising:
- a vertical tower assembly for housing and locating a plurality of electronic cables for supplying power and transferring electronic data to a plurality of portable electronic devices,
- the tower assembly defining a cable management vertical channel and a plurality of shelves coupleable to said vertical channel in a stacked vertical array, each shelf providing a storage bay defined by a bottom portion for supporting a portable electronic device on the shelf for storage and charging, the vertical channel and shelves further defining a plurality of first cable support apertures for support of and entry and exit of a plurality of electronic cables to and from the vertical channel and the shelves and between the vertical channel and each shelf, the said channel first cable support apertures and shelf first cable support apertures each providing convenient electronic cable access for at least one electronic device supported by each of the shelves at spaced locations on the channel,
- a laterally extending base coupleable to the cable management vertical channel wherein the base is configured to underlie the vertical channel and at least a portion of any of said shelves coupled to the vertical channel whereby the tower support is supported in a vertical position by the base and the plurality of shelves are supported in generally horizontal positions in cantilever fashion from the tower cable management vertical channel,
- the tower assembly further including a locking assembly having opposed first and second sidewalls, and a top wall coupled to the first and second sidewalls to overlap a topmost shelf portion of the tower assembly, at least one of the first and second sidewalls being coupleable to at least one of the plurality of shelves and the vertical channel, the locking assembly further providing at least one door pivotally coupleable to a one of the first sidewall and the second sidewall and movable between an open position for permitting user access to the shelf storage bays and a closed position for selectively limiting access to the storage bays, the at least one door being engageable with a locking mechanism on the tower assembly to selectively retain the at least one door in closed position to secure electronic devices within the shelves for storage and charging.

19. The countertop storage and management assembly of claim 18 wherein sufficient open space between the shelves and the locking assembly is provided when the at least one door is in a closed position to allow a user positioned externally of the tower assembly to visually confirm the presence and absence of electronic devices within the storage bays of each of the shelves of the storage and management assembly.

20. The countertop storage and management assembly of claim 18 wherein at least one power distribution assembly having a plurality of electrical outlets is provided for attachment within the tower assembly to provide electrical power for each electronic device positioned within each storage bay of the tower assembly.

21. The countertop storage and management assembly of claim 18 wherein the vertical channel defines a plurality of second cable support apertures which are smaller than the first cable sup ort apertures for receiving attachment apparatus for positioning and coupling electrical components to the vertical channel.

22. The countertop storage and management assembly of claim 18 wherein the vertical channel defines at least one third cable support aperture having a diameter greater than the first cable support apertures to provide entry into the vertical channel by at least one of a main power cable and a main communication cable.

23. The countertop storage and management assembly of claim 18 wherein at least one of the shelves defines at least one shelf second cable support aperture and a plurality of shelf third cable support apertures, which shelf third cable support apertures are smaller than the shelf first cable support apertures for entry of attachment apparatus for positioning and coupling electrical components to the shelf.

24. The countertop storage and management assembly of claim 18 wherein a plurality of resilient foot members are attached to a bottom surface of the laterally extending base to provide non-skid stability for the base on a support surface.

* * * * *

UNITED STATES PATENT AND TRADEMARK OFFICE
CERTIFICATE OF CORRECTION

PATENT NO. : 10,076,050 B2  
APPLICATION NO. : 15/076260  
DATED : September 11, 2018  
INVENTOR(S) : Roberts Page 1 of 2

It is certified that error appears in the above-identified patent and that said Letters Patent is hereby corrected as shown below:

On the Title Page

In Item (63), under "Related U.S. Application Data", in Column 1, Line 2, delete "20".

In the Specification

In Column 1, Line 11, delete "2013," and insert -- 2013, now Pat. No. 10,084,327, --, therefor.

In Column 1, Line 16, delete ""Improved Storage" and insert -- "Storage --, therefor.

In Column 1, Line 20, delete ""Improved Mobile" and insert -- "Mobile --, therefor.

In Column 2, Line 45, delete "whom are" and insert -- who are --, therefor.

In Column 6, Line 17, delete "view the" and insert -- view of the --, therefor.

In Column 6, Line 54, delete "a isometric" and insert -- an isometric --, therefor.

In Column 7, Line 30, delete "of a another" and insert -- of another --, therefor.

In Column 11, Line 47, delete "vertical" and insert -- vertically --, therefor.

In Column 12, Line 51, delete "This allow" and insert -- This allows --, therefor.

In Column 19, Line 43, delete "shown FIG. 16," and insert -- shown in FIG. 16, --, therefor.

In Column 20, Line 5, delete "FIG. 47" and insert -- FIG. 29 --, therefor.

In Column 20, Line 39, delete "FIG. 48" and insert -- FIG. 30 --, therefor.

Signed and Sealed this  
Twenty-second Day of October, 2019

Andrei Iancu  
*Director of the United States Patent and Trademark Office*

CERTIFICATE OF CORRECTION (continued)
U.S. Pat. No. 10,076,050 B2

In Column 20, Line 55, delete "seen from that" and insert -- seen that --, therefor.

In Column 22, Lines 32-33, delete "an central" and insert -- a central --, therefor.

In Column 27, Line 21, delete "FIGS. 22-49" and insert -- FIGS. 22-43 --, therefor.

In the Claims

In Column 29, Line 9, in Claim 2, delete "The storage and management tower assembly of claim" and insert -- The expandable storage assembly of claim --, therefor.

In Column 29, Line 11, in Claim 2, delete "at least a one" and insert -- at least one --, therefor.

In Column 29, Line 13, in Claim 3, delete "The storage and management tower assembly of claim" and insert -- The expandable storage assembly of claim --, therefor.

In Column 32, Line 1, in Claim 18, delete "to a one" and insert -- to one --, therefor.

In Column 32, Line 28, in Claim 21, delete "sup ort" and insert -- support --, therefor.